United States Patent [19]
Tenny

[11] 3,968,444
[45] July 6, 1976

[54] SKIP BAND TUNER

[75] Inventor: Ralph F. Tenny, Richardson, Tex.

[73] Assignee: Texas Instruments Incorporated, Dallas, Tex.

[22] Filed: Nov. 11, 1974

[21] Appl. No.: 522,675

[52] U.S. Cl. .............................. 325/470; 325/453; 325/455; 325/459; 325/465
[51] Int. Cl.² ........................................ H04B 1/32
[58] Field of Search ........... 325/452, 453, 458, 459, 325/464–466, 468–470; 334/11, 14, 15; 340/147 C, 171 A, 168 R

[56] References Cited
UNITED STATES PATENTS

| | | | |
|---|---|---|---|
| 3,654,557 | 4/1972 | Sakamoto et al. | 325/465 |
| 3,818,353 | 6/1974 | Sakamoto | 325/470 |
| 3,822,405 | 7/1974 | Sakamoto | 325/464 |
| 3,839,678 | 10/1974 | Bell | 325/468 |
| 3,845,394 | 10/1974 | Hamada | 325/464 |

*Primary Examiner*—Robert L. Griffin
*Assistant Examiner*—Jin F. Ng
*Attorney, Agent, or Firm*—Harold Levine; James T. Comfort; James O. Dixon

[57] ABSTRACT

A digital tuning controller is provided which utilizes the storage of codes relating to the location and bandwidth of unused or illegal frequency bands to control a frequency acquisition operation with minimum circuitry.

A two digit keyboard entry corresponding to a selected channel number is stored. First counter means indicates a current channel location. Second counter means counts regularly spaced frequency markers produced as the band is scanned to increment the first counter. A comparator signals coincidence between the content of the first counter and the keyboard entry. A third counter counts the frequency markers for comparison with the current output state of a read only memory (ROM) having stored codes corresponding to the location and bandwidth of the unused frequency bands. Upon coincidence, the third counter is reset, the second counter is inhibited and the next succeeding location of the ROM is addressed to provide an output state indicating the bandwidth of the skip band. Upon coincidence again occurring between the ROM and the third counter, the second counter is activated to resume counting and the tuning operation continues until either another skip band is reached or the selected channel is acquired.

18 Claims, 14 Drawing Figures

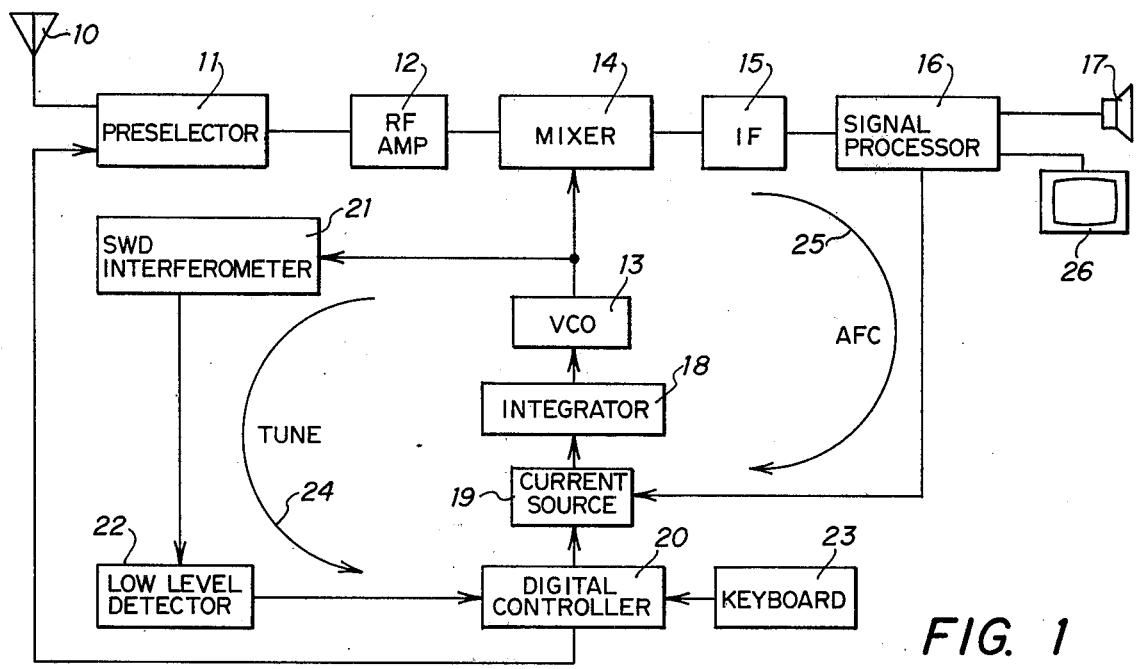
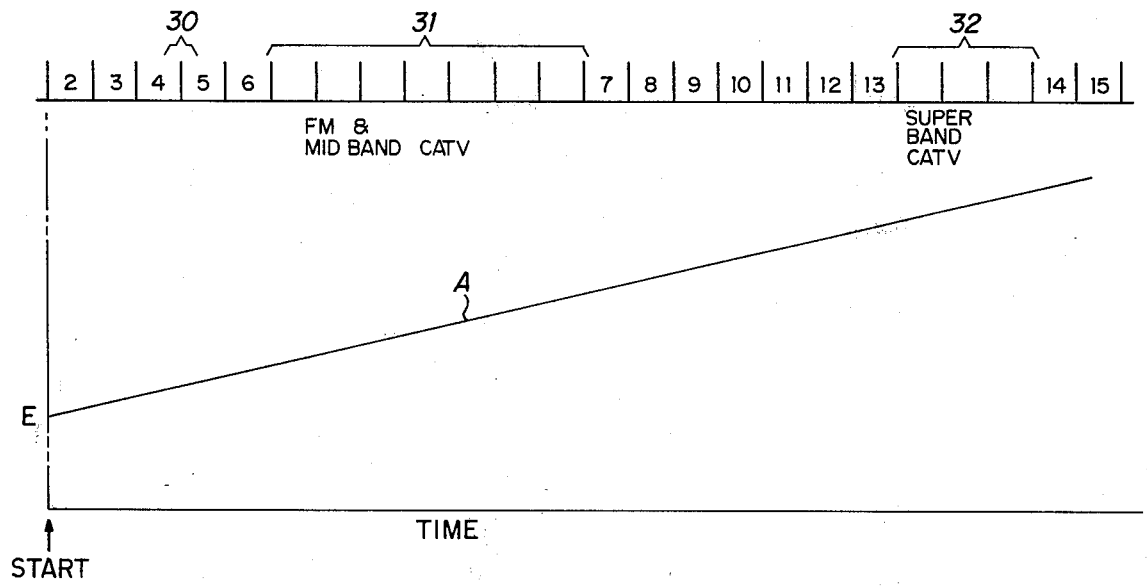
FIG. 1

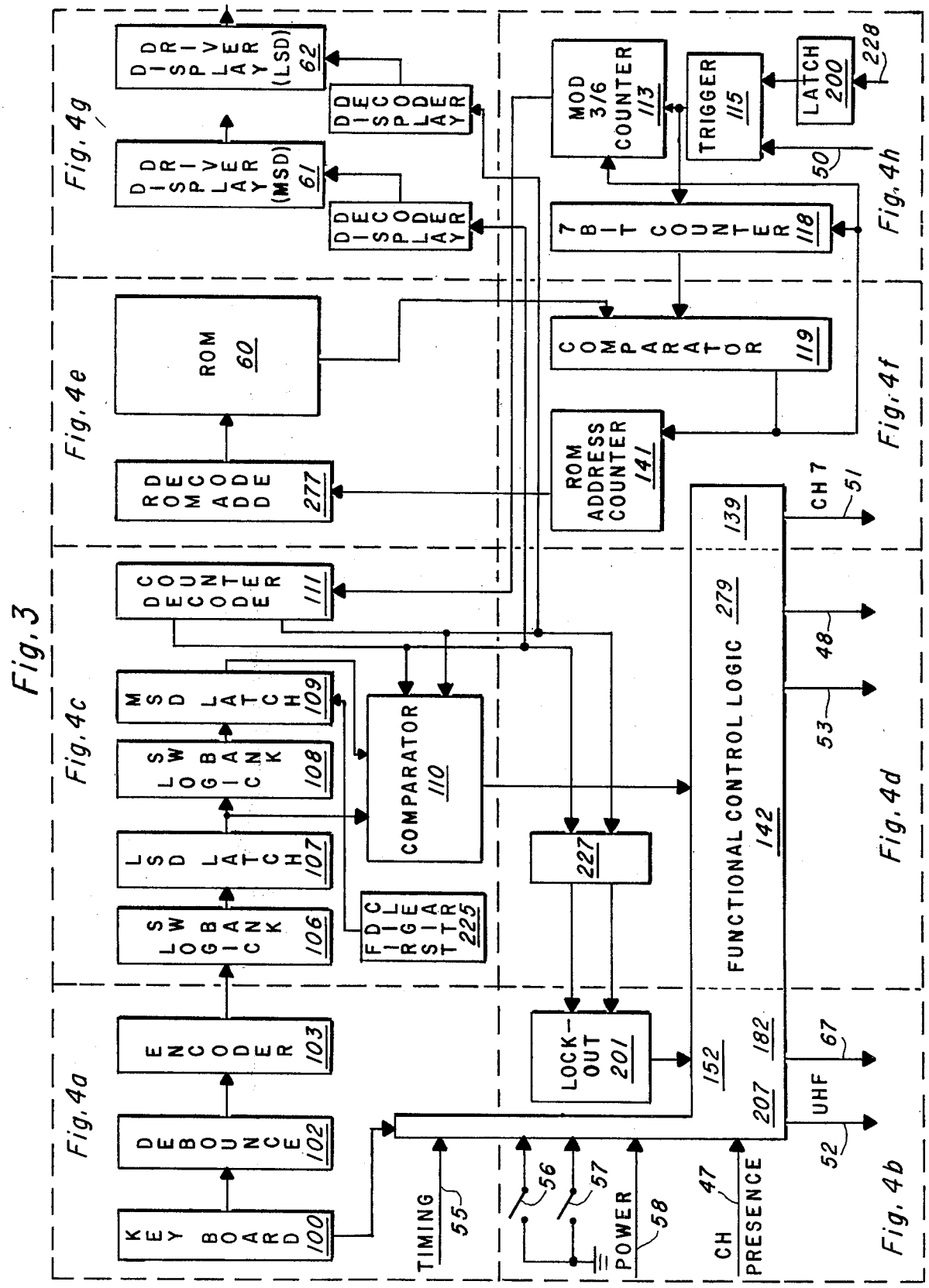

SKIP BAND TUNER

FIELD OF THE INVENTION

This invention relates to automatic tuning of receiver systems such as television, and more particularly to circuit minimization in scanning a band in which a selected channel is located. In a more specific aspect, the invention involves the ROM storage of channels to be skipped and controls utilizing such storage.

PRIOR ART

In the transmission of television signals in the United States, the VHF channels 2-13 are not in continuous sequence, but rather have interspersed therein other allocations not related to television transmission. In addition, the VHF and UHF bands are separated by a band of frequencies devoted to other than television transmission.

Further, as is well known, the VHF band and the UHF band have channel allocations of a 6 MHz bandwidth per channel as shown in the following Table.

TABLE I

| VHF Channel | Freq. Band | Picture Freq. |
| --- | --- | --- |
| 2 | 54-60 MHz | 55.25 MHz |
| 3 | 60-66 | 61.25 |
| 4 | 66-72 | 67.25 |
| 5 | 76-82 | 77.25 |
| 6 | 82-88 | 83.25 |
| FM | 88-108 | |
| Midband CATV | 108-174 | |
| 7 | 174-180 | 175.25 |
| 8 | 180-186 | 181.25 |
| 9 | 186-192 | 187.25 |
| 10 | 192-198 | 193.25 |
| 11 | 198-204 | 199.25 |
| 12 | 204-210 | 205.25 |
| 13 | 210-216 | 211.25 |
| Superband CATV | 216-290 | |
| UHF Channel | Freq. Band | Picture Freq. |
| 14 | 470-476 | 471.25 |
| — | — | — |
| — | — | — |
| — | — | — |
| 69 | 800-806 | 801.25 |
| Land Mobile | 806-890 | |

In tuning a superheterodyne receiver in the VHF or UHF ranges, it is necessary to provide a local oscillator having a variable frequency output. Further, it is desirable that the selection of a given local oscillator frequency be accomplished by actuation of relatively simple keyboard inputs.

In systems such as disclosed in U.S. application Ser. No. 504,626, filed Sept. 9, 1974, entitled "Frequency Selection and Control" and assigned to the assignee of the present application, tuning involves the variation in the output of a local oscillator to produce an output pulse at 1.0 MHz intervals as the oscillator frequency sweeps over the band of interest. The output pulses have been colloquially described as fence posts which provide frequency scale markers regularly spaced across the band over which the oscillator operates. The pulses or fence posts are counted during each tuning operation as the oscillator sweeps upward from a reference point at a lower end of the VHF channel.

A keyboard input addresses a ROM having stored therein codes corresponding to the location of each available channel relative to the reference point. More particularly, each code specifies the number of fence posts between a selected channel and the reference point. A comparator then is utilized to transfer control of the oscillator output from a tuning mode to an automatic frequency control (AFC) mode when the count of the fence posts corresponds with the code for the desired channel.

It will be noted from Table I that there is a skip band of 4.0 MHz between channels 4 and 5 and that there is a skip band between channels 6 and 7 from 88 MHz to 174 MHz. Prior systems provide encoding of each of the frequencies of the channels to which tuning is to be accomplished, but ignore these frequencies within the skip bands.

The present invention is directed toward minimization of the size of the ROM used for storage of tuning information. If the number of stations to be selected is large, as is generally the case, compared with the number of channels that are to be ignored or not used in a given operation, then a relatively small size read only memory (ROM) can be employed to encode only the frequencies that are to be skipped. This results in a significant minimization of the circuitry involved in the tuning operation.

SUMMARY OF THE INVENTION

The present invention is directed to a digital tuning controller which employs stored indicia relating to the location and size of unused frequency bands in a field of operation to direct a frequency acquisition process.

More particularly, regularly spaced frequency markers produced from the variable output of a local oscillator are counted to signal the proximity of succeeding channels, and the aggregate is compared with the stored indicia to identify unused frequency bands. When the lower frquency boundary of an unused band is acquired, the acquisition process is suspended until the local oscillator is driven to the upper boundary of the band, as determined from a comparison between the stored indicia and counted frequency markers. The acquisition process then continues until either a selected frequency is acquired or another unused band is confronted.

In a preferred embodiment, there is provided a digital tuning controller having a modulo 3/6 binary counter for signaling the outer frequency boundaries of channel allocations, a decade counter incremented by the modulo 3/6 counter and indicating the current channel location of a search or tune operation, an encoder receiving keyboard entries indicating selected channel numbers, and a comparator to signal a selected channel acquisition upon coincidence between the decade counter and the encoded input. There further is provided a read only memory (ROM) having stored therein codes relating to the location and size of unused or illegal frequency bands, a binary counter indicating the frequency interval of separation between a current frequency location and a reference frequency, and a comparator to signal a coincidence between the binary counter and a current output state of the ROM. The lower boundary of an unused frequency band is identified upon coincidence, and the count of the modulo 3/6 counter is suspended until the upper boundary of the unused band is similarly identified.

DESCRIPTION OF THE DRAWINGS

The novel features believed characteristic of the invention are set forth in the appended claims. The invention itself, however, as well as further objects and advantages thereof, will best be understood by reference to the following detailed description of an illustrative embodiment taken in conjunction with the accompanying drawings, in which:

FIG. 1 is a block diagram of a system embodying the invention;

FIG. 2 illustrates local oscillator frequency variation involved in operating the present invention;

FIG. 3 is a map of FIGS. 4a–4h showing in block diagram form the location and interconnection of the principal elements in those figures;

DESCRIPTION OF PREFERRED EMBODIMENTS

Figure 4A:
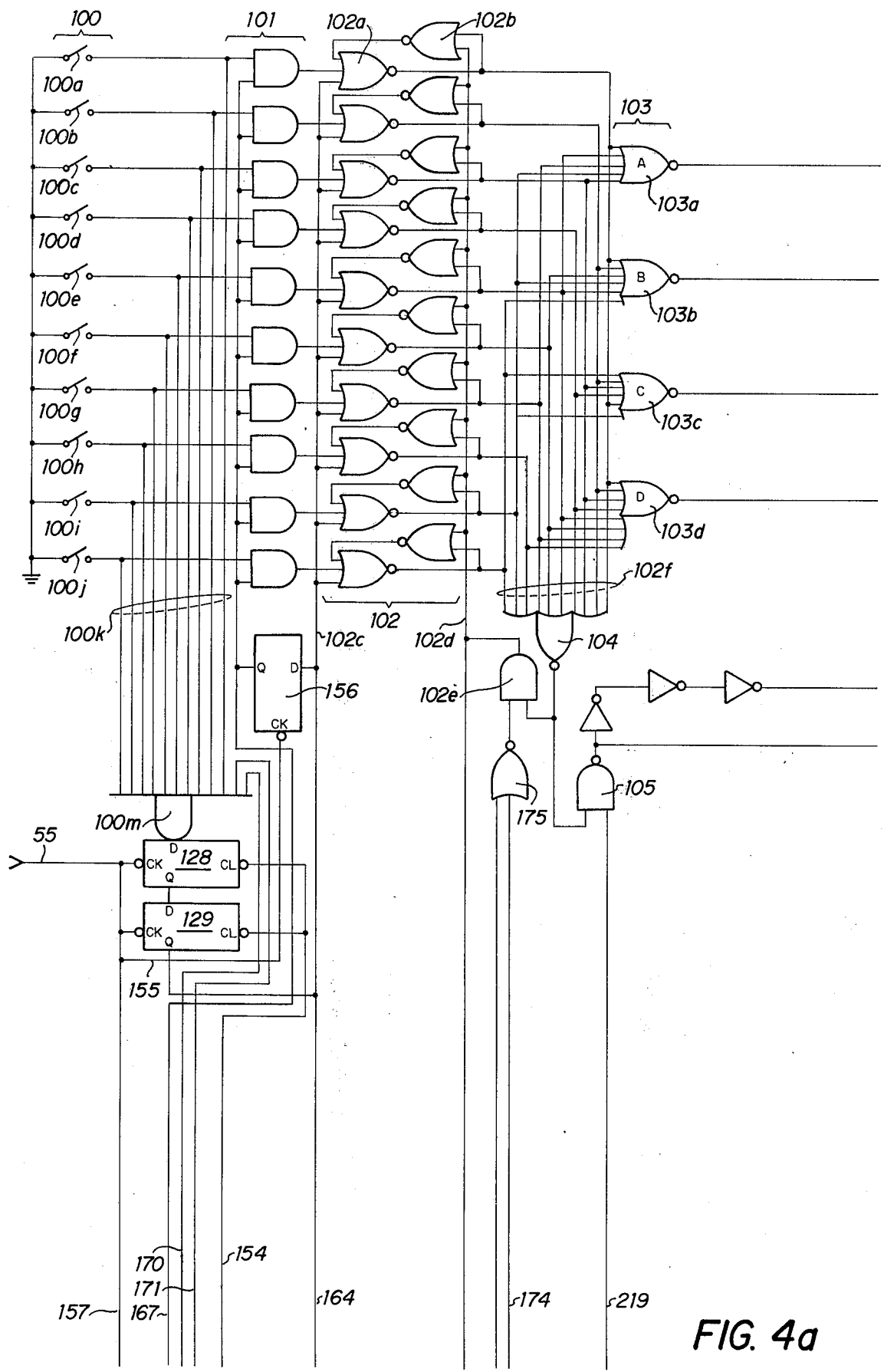
FIGS. 4a–4h illustrate a control circuit in large size integrated circuit form for practicing the invention.

Referring to FIG. 1, a television tuning system is illustrated which embodies the present invention. A signal from an antenna 10 is passed through a preselector 11, an RF amplifier 12, and thence to a mixer 14. The mixer 14 is provided with a second input from a voltage controlled oscillator 13. The output of the mixer is applied to an IF strip 15, within which the product signal from mixer 14 is amplified and filtered in accordance with conventional techniques. The output of IF strip 15 then is applied to a conventional signal processing unit 16, which in turn applies an audio signal to a speaker 17 and a video signal to a display tube 26.

The oscillator 13 is a voltage controlled oscillator (VCO) which is varied in frequency by the output of an integrator 18. The integrator in turn is controlled by the output of a current source 19, the duty cycle of which is controlled by a digital controller 20 embodying the present invention.

The output of VCO 13 is also applied to an SWD interferometer 21, which is a surface wave device so connected and operated in the system as to produce output markers at selected frequencies across the band over which VCO 13 is caused to sweep. More particularly, as disclosed in U.S. application Ser. No. 504,626, filed Sept. 9, 1974, and assigned to the assignee of the present application, interferometer 21 comprises an SWD having two output channels characterized by predetermined differential delays of the VCO 13 signal. The SWD signals are applied to the inputs of a summing amplifier which in turn supplies a signal to a low level detector 22. The detector 22 thus provides output markers corresponding to the edges of frequency windows through which VCO output signal 13 passes in response to control by integrator 18. In the preferred embodiment described herein, the output markers are produced at regular 1.0 MHz frequency intervals as the oscillator sweeps across a range of frequencies. The frequency markers so produced are applied to digital controller 20 to conduct a search upward from channel 2 to acquire the channel selected by depressing keys at keyboard 23.

When a selected channel frequency has been acquired, control of current source 19 is transferred from tune loop 24 to AFC loop 25. More particularly, control of the current source 19 transfers from digital controller 20 to signal processor 15 to track the selected signal.

In operation, a channel is selected by depressing keys at keyboard 23, whereupon digital controller 20 sets a broad bandpass filter at preselector 11 for either VHF or UHF reception. A composite signal including frequency modulated audio and amplitude modulated video signals is received by antenna 10 and applied through preselector 11 and RF amplifier 12 to mixer 14.

Upon initiating a tune command, digital controller 20 is reset to begin an upward search from channel 2. During the tuning operation, the duty cycle of current source 19 is controlled by digital controller 20 to drive integrator 18, which in turn applies a ramp voltage to VCO 13. In response to the ramp voltage, the VCO 13 output frequency sweeps upward from channel 2 and through the VHF and UHF bands.

The output of VCO 13 is processed by interferometer 21 and detector 22 to produce output pulses at regular frequency intervals which are counted by digital controller 20. As the allocated channel frequencies are spaced 6.0 MHz apart, a new channel is indicated each time a number of frequency markers corresponding to a 6.0 MHz interval have been counted.

The output frequency of VCO 13 thus continues to sweep upward, and the frequency markers from detector 22 continue to be counted until the number of 6.0 MHz intervals corresponds to the channel number entered at keyboard 23. Acquisition of the selected channel is then indicated, and control of current source 19 transfers from tune loop 24 to AFC loop 25 to track the signal at the selected channel location.

With reference to FIG. 2, the output voltage of integrator 18 varies as represented by curve A. In response, the frequency of oscillator 13 changes so that there will be a succession of channels to which the system is tuned. For convenience, these have been numbered as in Table I.

As channels for television reception span both the UHF band and the VHF band, certain of the bands 30, 31 and 32 are to be skipped in the tuning operation. For example, a frequency set 32 to which interferometer 21 tunes the oscillator lies between the UHF and VHF bands. The frequencies within set 32 are not allocated to television transmission, and thus are to be skipped. Another frequency range to be skipped, set 31, lies between VHF channels 6 and 7. Another frequency range to be skipped, set 30, lies between channels 4 and 5.

Heretofore receiver systems have been provided utilizing control from a ramp generator such as integrator 18 to vary the frequency of a voltage controlled oscillator, as in said U.S. application Ser. No. 504,626. In such prior art systems, a ROM has been provided with stored data to address each of the many channels lying within a broadcast band. This has resulted in the necessity of a very large ROM. In contrast, and in accordance with the present invention, a digital controller is provided having a ROM with stored data corresponding only to those channels that are to be skipped. This permits automatic tuning through the entire broadcast band with use of a very small ROM which is actuated to skip sets of frequencies such as sets 30, 31 and 32.

FIGS. 4a–4h, arranged as shown in FIG. 3, illustrate in logic circuit form a system embodying the present invention. The system, employed as a digital controller in the receiver system of FIG. 1, may be embodied as a large scale integrated circuit formed on a single MOS chip. However, it is to be understood that an interface chip may be required to communicate with peripherals exceeding the load capacity of the MOS chip.

More particularly, the system of FIGS. 4a–4h comprises a keyboard 100 providing manual inputs for channel selection. A least significant digit latch 107 and a most significant digit latch 109 store the channel number entered into keyboard 100. A decade counter 111 indicates the current channel number to which the system is tuned. A read only memory (ROM) 60 has stored therein information corresponding to the location and bandwidth of frequency bands to be skipped. Conventional BCD to seven segment decoder/drivers 61 and 62 supply the channel number indicated by counter 111 to a two digit display (not shown). A modulo 3/6 counter 113 counts frequency markers supplied by an external analog comparator to increment counter 111. A seven bit binary counter 118 also counts the frequency markers to compare with the output states of ROM 60. A comparator 119 signals coincidence between the content of counter 118 and an output state of ROM 60. A ROM address counter 141 increments an address decode circuit 277 addressing ROM 60.

Considering the foregoing components in more detail, keyboard 100, FIG. 4a, comprises ten switches 100a–100j corresponding to the numerals 0–9, respectively. The closure of any one switch grounds the input to one of a set of AND gates 101. The lines leading from the switches 100 to the AND gates 101 are also connected by way of lines 100k as inputs to an AND gate 100m. The outputs of AND gates 101 in turn are applied to a debounce circuit 102 comprising an array of ten NOR gates 102a and ten NOR gates 102b.

NOR gates 102a each have one input connected to one of the AND gates 101, while the second inputs of each of the gates 102a are connected in parallel to line 102c. Each of the NOR gates 102b has one input connected to the output of one of the NOR gates 102a, and a second input supplied by way of line 102d. The state of line 102d is controlled by the output of an AND gate 102e, while the state of line 102c is controlled by the Q output of a flip-flop 129.

The outputs of NOR gates 102a are also applied to an encoding circuit 103 comprising four NOR gates 103a, 103b, 103c and 103d, and by way of lines 102f to the input of a NOR gate 104. Gate 104 is a strobe gate signaling the depression of a keyboard 100 switch. The output of gate 104 is applied as an input to AND gate 102e and a NAND gate 105.

Figure 4B:
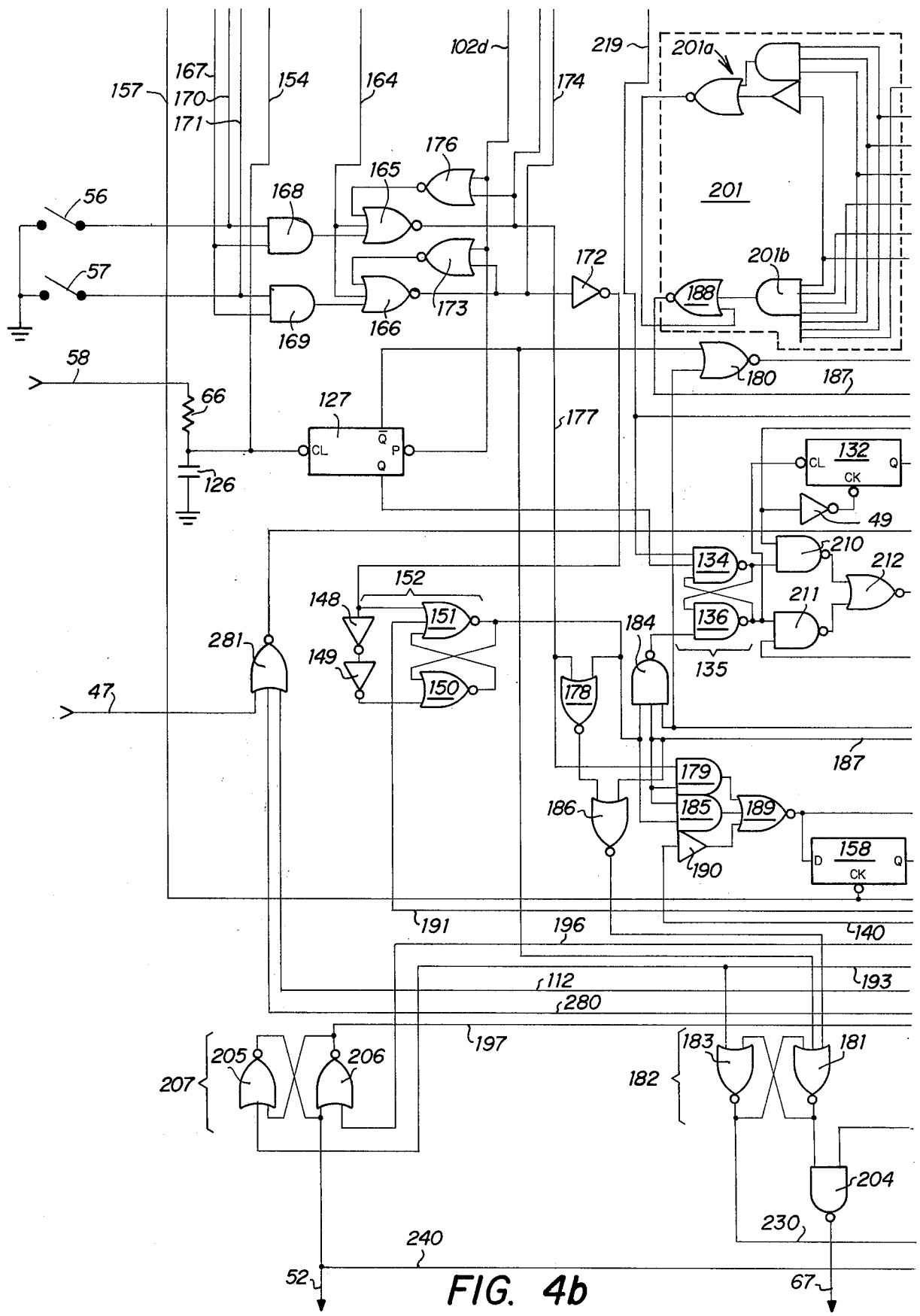
Figure 4C:
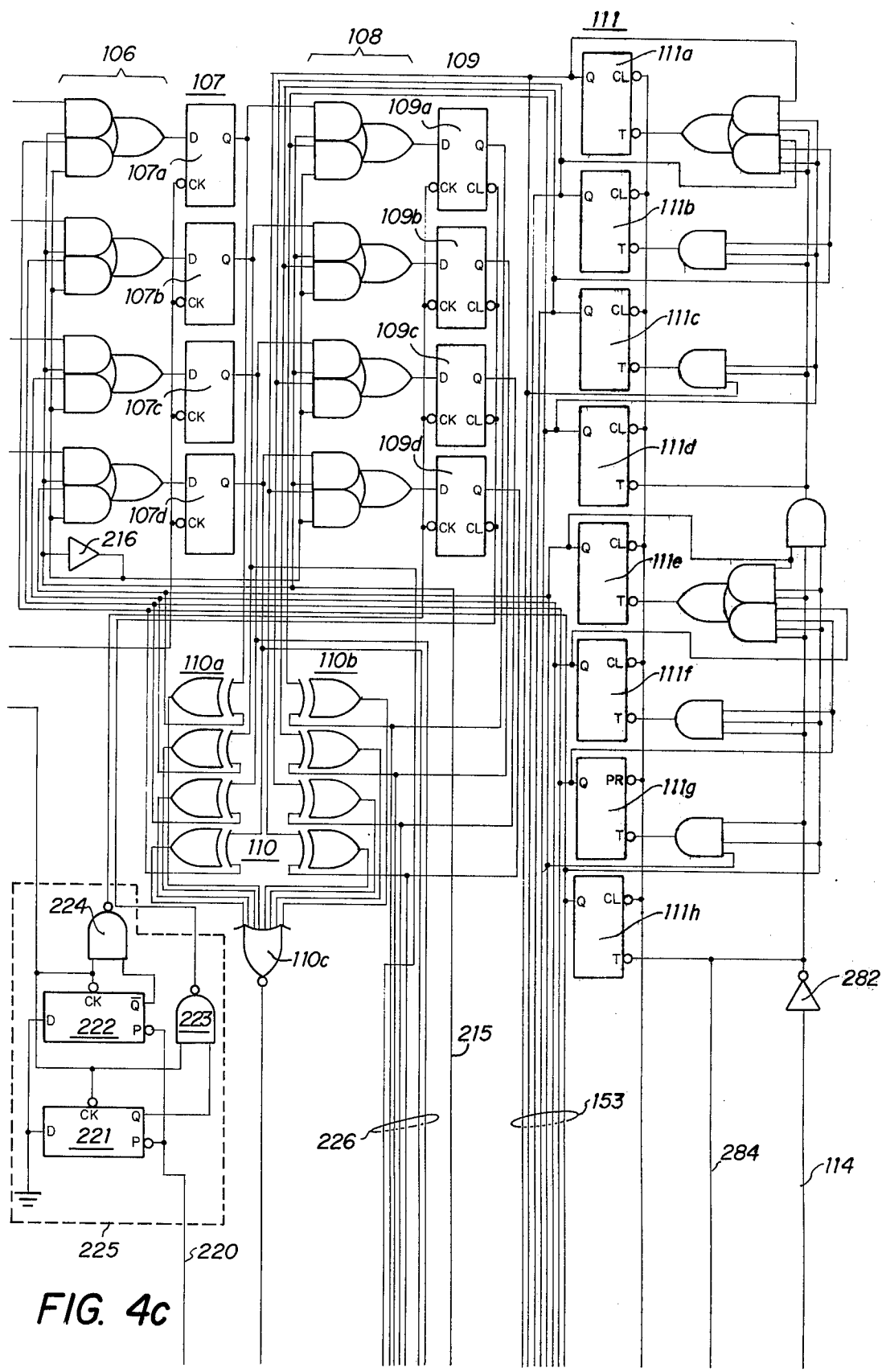

The outputs of NOR gates 103a–103d in turn are applied through logic switch bank 106, FIG. 4c, to the D inputs of a first latch 107 comprised of flip-flops 107a–107d.

The Q outputs of flip-flops 107a–107d are connected as inputs to a second logic switch bank 108, the outputs of which are connected to the D inputs of a second latch 109 comprising flip-flops 109a–109d. The latch 107 stores the least significant digit of a channel number selected at keyboard 100, while latch 109 stores the most significant digit of the selected channel number.

The Q outputs of the flip-flops 107a–107d also are connected as inputs to an array of four exclusive OR gates 110a forming a least significant digit part of a comparator 110, and as inputs to a lockout circuit 201, FIG. 4b. Second inputs to each of the exclusive OR gates 110a are supplied by the Q outputs of flip-flops 111e–111h forming a least significant digit register of a decade counter 111.

The Q outputs of flip-flops 109a–109d are connected as inputs to an array of four exclusive OR gates 110b forming a most significant digit part of comparator 110, and as inputs to lockout circuit 201. Second inputs to each of the exclusive OR gates 110b are supplied by the Q outputs of flip-flops 111a–111d forming a most significant digit register of decade counter 111.

The outputs of each of the exclusive OR gates 110a and 110b are connected as inputs to a NOR gates 110c. Exclusive OR gates 110a and 110b together with NOR gate 110c comprise comparator 110. Upon coincidence occurring between the numbers stored in latches 107 and 109 and the numbers stored in decade counter 111, the output of NOR gate 110c is raised to a logic one level.

As before described, the Q output of latches 107 and 109 supply inputs to lockout circuit 201. More particularly, the Q outputs of flip-flops 107b–107d and flip-flops 109a–109d are connected by way of lines 226 through a bank of seven inverters 227, FIG. 4d, to the inputs of logic switch 201a and AND gate 201b. The outputs of logic switch 201a and AND gate 201b in turn are applied as inputs to NOR gate 188. Lockout circuit 201 is utilized to prevent either tuning or searching to an illegal or unused TV channel, including channels 0, 1, or 84–99 inclusive. When an illegal channel is selected, the output of NOR gate 188 transitions from a normal logic one state to a logic zero state to inhibit system reset and thus prevent a search or tune operation.

Figure 4D:
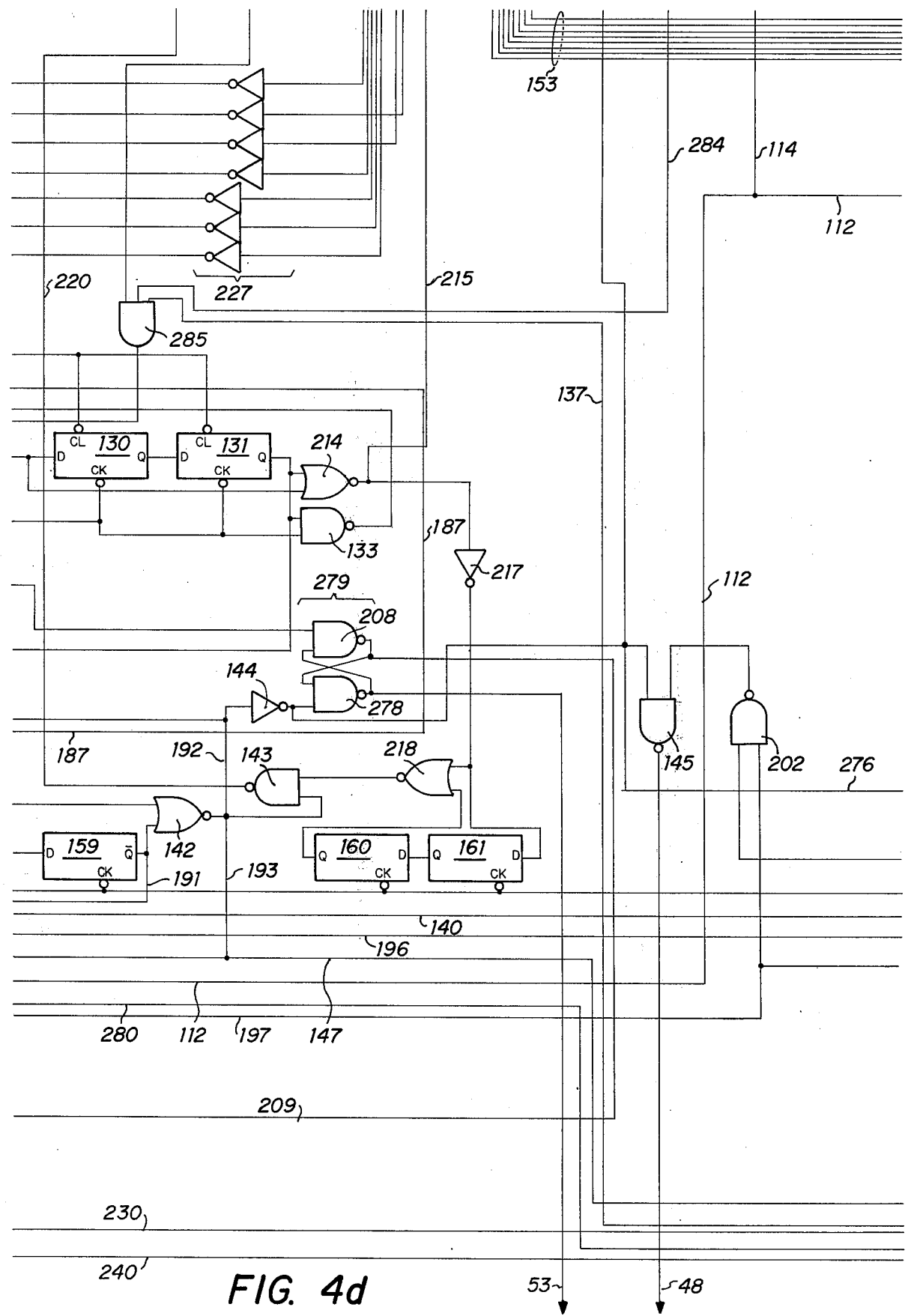
Figure 4E:
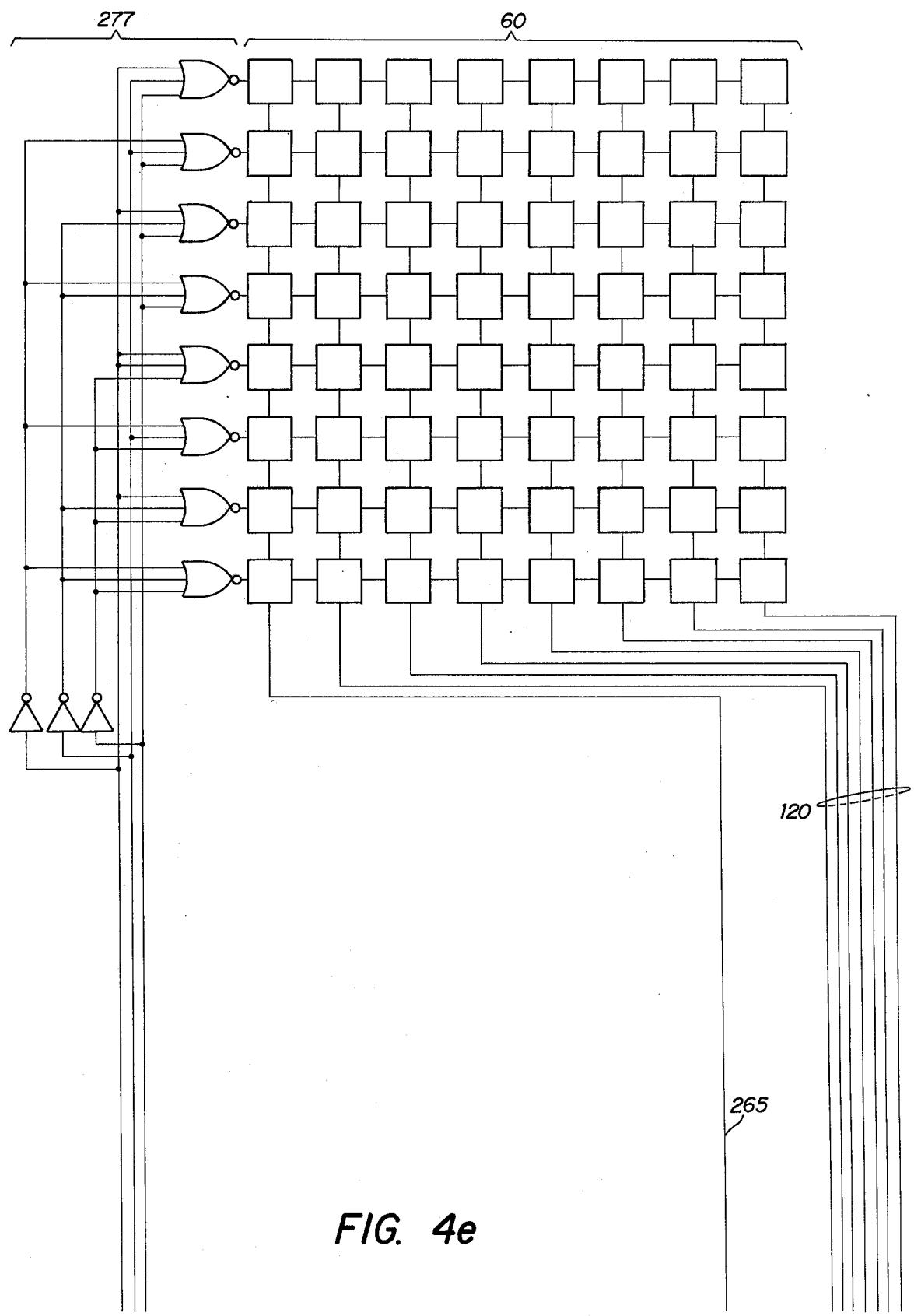
Figure 4F:
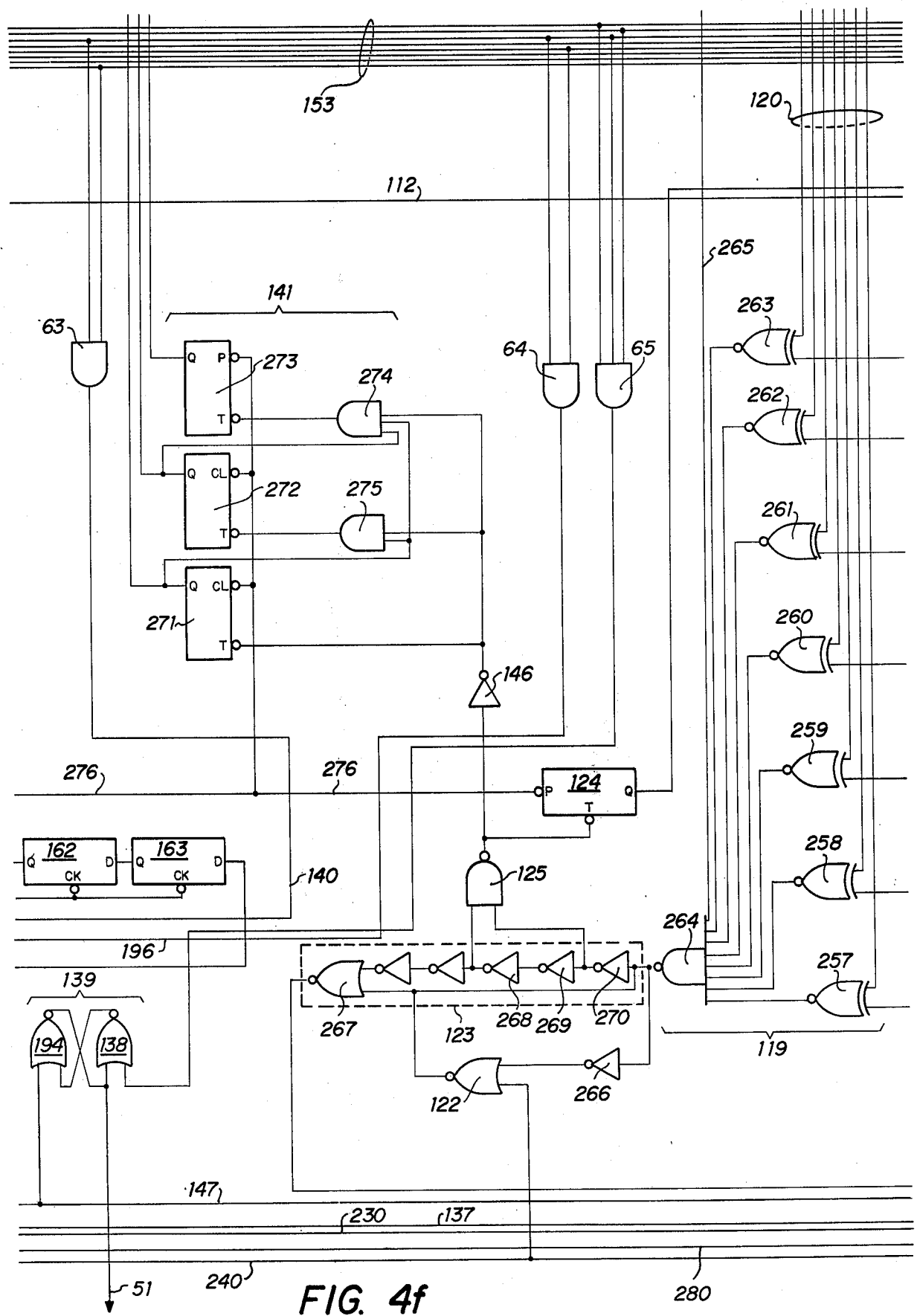
Figure 4G:
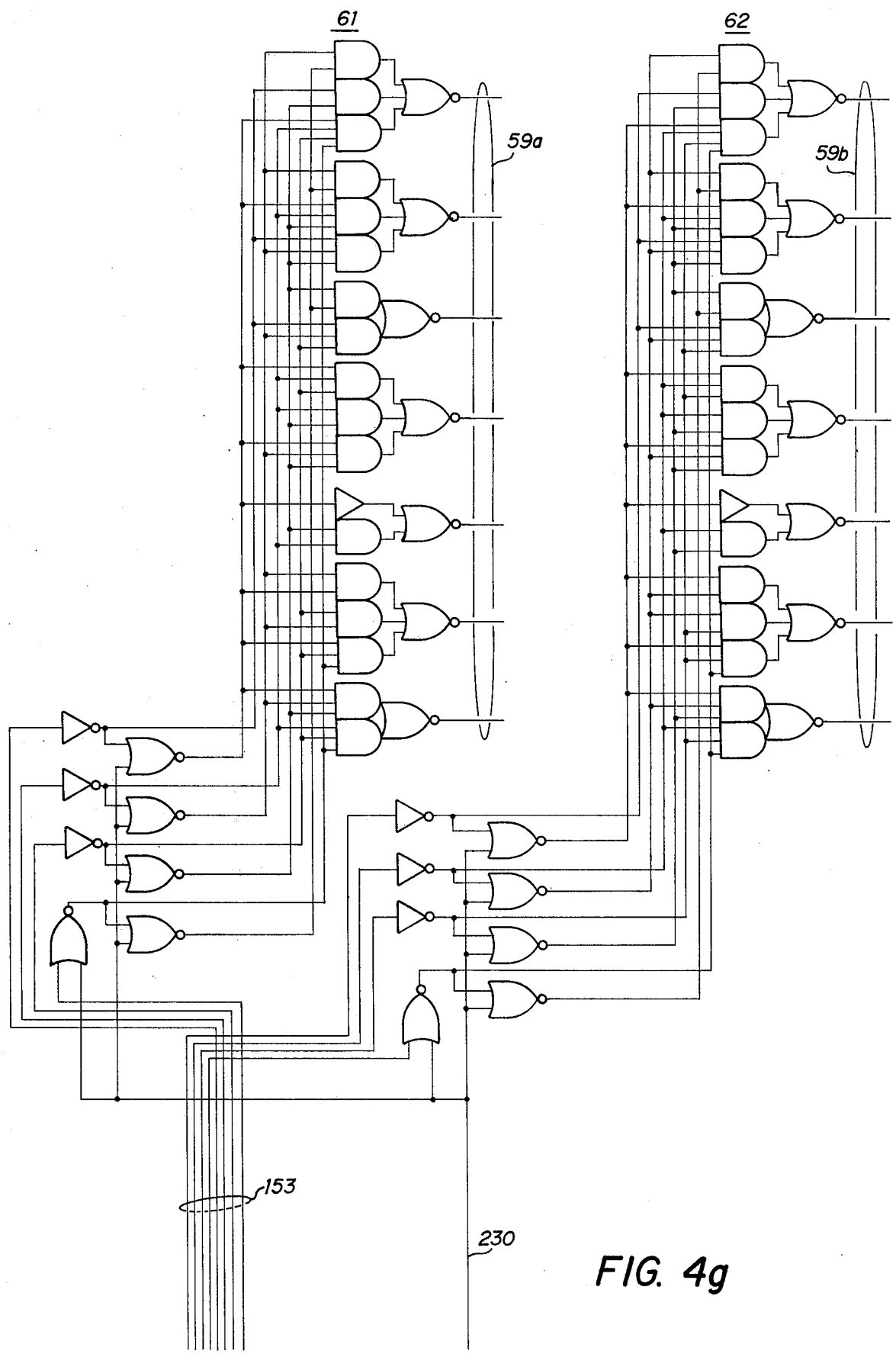

Referring to counter 111, FIG. 4c, the Q output of flip-flops 111a–111h are also applied by way of lines 153 to conventional BCD to seven segment decoder/driver circuits 61 and 62, FIG. 4g. Driver circuits 61 and 62 in turn drive two digit display indicating a channel of operation corresponding to the contents of decade counter 111. More particularly, circuit 61 drives a most significant digit display by way of output lines 59a, while circuit 62 drives a least significant digit display by way of output lines 59b. As circuits 61 and 62 are fully disclosed at page 176 of the publication by Texas Instruments Incorporated entitled "The TTL Data Book for Design Engineers", First Edition, Copyright 1973, the circuits are not described in further detail herein.

The Q outputs of flip-flops 111a and 111f are also connected by way of lines 153 as inputs to AND gate 63, FIG. 4f. When the number in decade counter 111 is equal to the numeral 84 corresponding to channel 84, the output of AND gate 63 is raised to a logic one level to signal that the allocated channel frequencies have been overreached.

In addition, the Q outputs of flip-flops 111d and 111f are connected by way of lines 153 to the inputs of an AND gate 64 to signal the transition from VHF channel 13 to UHF channel 14. Further, the Q outputs of flip-flops 111f, 111g and 111h are connected by way of lines 153 to the inputs of AND gate 65 to signal a channel 7 operation.

Power is applied to the system by way of a line 58, FIG. 4b, which is connected to a resistor 66 in series with a capacitor 126 having one terminal at ground. The node intermediate to resistor 66 and capacitor 126 is connected to the clear input of a flip-flop 127, and by way of a line 154 to the clear input of flip-flops 128 and 129. In the quiescent state, capacitor 126 is discharged and thereby clears flip-flops 127, 128 and 129. In the power-up state, however, when power is supplied by way of line 58 to charge capacitor 126, flip-flops 127, 128 and 129 are free to operate under the command of either clock or preset signals.

Timing control for the sytem is derived from a 60 cycle vertical oscillator applying a timing signal by way of line 55, FIG. 4a, to the clock input of flip-flops 128 and 129, by way of line 155 to the clock input of a flip-flop 156, and by way of line 157 to the clock input of flip-flops 158, 159, 160, 161, 162 and 163.

The D input of flip-flop 128 is supplied by AND gate 110m, and the Q output is applied to the D input of flip-flop 129. The Q output of flip-flop 129 in turn is connected to the D input of flip-flop 156, to one input each of NOR gates 102a, and by way of line 164 to an input of NOR gates 165 and 166, FIG. 4b.

The Q output of flip-flop 156 is connected to a second input of AND gates 101, and by way of line 167 to an input of AND gates 168 and 169. A second input to AND gate 168 is connected to SPST switch 56 having a contact terminal connected to ground, and by way of line 170 to an input of AND gate 100m.

A second input to AND gate 169 is connected to SPST switch 57 having a contact terminal connected to ground, and by way of line 171 to an input of AND gate 100m. Switches 56 and 57 are depressed to initiate a tune or a search sequence, respectively.

AND gates 168 and 169 supply inputs to NOR gates 165 and 166, respectively. The output of NOR gate 166 is connected as an input to a NOR gate 173, which in turn supplies an input to NOR gate 166. The output of NOR gate 166 is also applied by way of line 174 as an input to NOR gate 175, and through an inverter 172 as an input to a flip-flop circuit 152. The output of NOR gate 175 is connected as one input to AND gate 102e.

NOR gate 165 supplies an input to a NOR gate 176, an input to a NOR gate 175, and an input by way of line 177 to a NOR gate 178 and an AND gate 179. NOR gate 176 in turn supplies an input to NOR gate 165.

Flip-flop circuit 152, FIG. 4b, comprises a latch circuit formed from NOR gates 150 and 151, with an input from inverter 172 applied directly to gate 151 but delayed through inverters 148 and 149 as an input to gate 150. The flip-flop circuit 152 supplies an input to NOR gate 178, a NAND gate 184 and an AND gate 185. The output of NOR gate 178 in turn is applied as an input to a NOR gate 186, the output of which is applied as an input to a NOR gate 181. A second input to NOR gate 186 is connected to a line 187 leading to an input of NAND gate 184, to an input of AND gate 179, and to an input of AND gate 185. Also connected to line 187 is the output of a NOR gate 188, a component part of lockout circuit 201.

The $\overline{Q}$ output of flip-flop 127 is applied as an input to a NOR gate 180, and to a NOR gate 181 of a latch circuit 182. The present input to flip-flop 127 is connected to inputs of NOR gates 173 and 176, and to line 102d. The Q output of flip-flop 127 is connected to one input of a NAND gate 134, which is joined to a NAND gate 136 to form a latch circuit 135.

The outputs of AND gates 179 and 185 are applied as inputs to a NOR gate 189, the third input of which is supplied by AND gate 63 by way of line 140 through driver 190.

The output of NOR gate 189 is applied to the D input of flip-flop 158 and to one input of NOR gate 142. The Q output of flip-flop 158 is connected to the D input of flip-flop 159, FIG. 4d, while the $\overline{Q}$ output of flip-flop 159 is connected directly to a second input of NOR gate 142 and by way of line 191 to an input of NOR gate 151. Flip-flops 158 and 159 form a monostable multi-vibrator circuit with NOR gate 142, the circuit being triggered by NOR gate 189.

The output of NOR gate 142, FIG. 4d, supplying a system reset pulse, is applied as an input to a NAND gate 143, and by way of line 192 as an input to inverter 144, NAND gate 184 and NOR gate 180. The output of NOR gate 142 is also applied by way of line 193 as an input to NOR gate 183 and NOR gate 205, by way of lines 193 and 147 as an input to a NOR gate 194, a NOR gate 213, and NOR gates 195 and 199. In addition, NOR gate 142 supplies a reset pulse to the succeeding receiver system by way of lines 193 and 147 to output line 48.

NOR gates 205 and 206 comprise a latch circuit 207 controlling the state of a line 52 to flag a transition from VHF operation to UHF operation. A second input to latch 207 is supplied by AND gate 64 along line 196 to an input of NOR gate 206. The output of NOR gate 205 is connected to line 52, while the output of NOR gate 206 is connected by way of line 197 to the D input of flip-flop 163 and to one input of a NAND gate 202. The output of gate 202 in turn supplies a logic signal to trigger NAND gate 145 and flag a system reset condition on line 48.

The Q output of flip-flop 163, FIG. 4f, is connected to the D input of flip-flop 162, and the Q output of flip-flop 162 is connected as a second input to NAND gate 202. NAND gate 202 and flip-flop 162 and 163 comprise a monostable multivibrator.

While capacitor 126, FIG. 4b, is in a discharged state, flip-flop 127 remains cleared with a $\overline{Q}$ output at a logic one state. The output of NOR gate 180 is thus at a logic zero state which is applied to the clear inputs of flip-flops 130 and 131.

After power has been applied along line 58 to charge capacitor 126, the depression of a switch at keyboard 100 will be signaled by the occurrence of a logic zero at the output of NOR gate 104. The logic state of line 102d correspondingly drops to a logic zero and flip-flop 127 is preset. The Q output of flip-flop 127 is thus raised to a logic one state which is applied to NAND gate 134.

The output of NAND gate 134, FIG. 4b, is applied as an input to NAND gate 210, while the output of NAND gate 136 is applied as an input to NAND gate 211 and the clear input of a flip-flop 132. The outputs of NAND gates 210 and 211 in turn are applied as inputs to a NOR gate 212. the output of which is connected to an input of NAND gate 208, FIG. 4d. NAND gates 208 and 278 form a latch circuit 279, while NAND gates 134 and 136 form a latch circuit 135.

The output of NAND gate 136 is also applied to the clear input of a flip-flop 132, the clock input of which is supplied by an AND gate 285 through an inverter 49. The Q output of flip-flop 132 is applied to both the D input of flip-flop 130, FIG. 4d, and an input of a NOR gate 214.

The Q output of flip-flop 130 in turn is connected to the D input of flip-flop 131, the Q output of which is connected as an input to NOR gate 214, NAND gate 133, and AND gate 211.

The output of NAND gate 133 is applied to NAND gate 134 to reset latch 135 and is connected by line 219 to NAND gate 105, FIG. 4d. NAND gate 105 supplies a clock pulse through three inverters to the clock inputs of latch 107, and supplies an input to a first digit clear circuit 225.

The output of NOR gate 214, FIG. 4d, is applied along line 215 as an input to logic switch banks 106 and 108, and as an input to inverter 216 supplying additional inputs to the logic switch banks. NOR gate 214 also supplies an input to inverter 217 which triggers a monostable multivibrator circuit comprising NOR gate 218 and flip-flops 160 and 161.

More particularly, the output of inverter 217 is connected to an input of NOR gate 218 and to the $\overline{D}$ input of flip-flop 161. The Q output of flip-flop 161 is connected to the D input of flip-flop 160. the Q output of flip-flop 160 in turn is connected as an input to NOR gate 218.

The output of NOR gate 218, FIG. 4d, supplies an input to NAND gate 143, the output of which is connected by way of line 220 to the preset input of flip-flops 221 and 222 of circuit 225. The Q output of flip-flop 221 is applied as an input to a NAND gate 223, the output of which is connected to the clear input of flip-flops 109a–109d. The $\overline{Q}$ output of flip-flop 222 is connected as an input to a NAND gate 224 which supplies a clock signal to flip-flops 109a–109d. The clock signals to flip-flops 221 and 222, and second inputs to NAND gates 223 and 224 are supplied by NAND gate 105. The D inputs of flip-flops 221 and 222 are connected in parallel to ground.

Flip-flops 221 and 222 and NAND gates 223 and 224 comprise circuit 225 which accommodates the entry of a single digit channel number at keyboard 100. Thus, the depression of a second keyboard switch to enter a zero as a most significant digit in latch 109 is obviated.

When a system reset condition exists, NOR gate 142, FIG. 4d, applies a pulse to inverter 144 and to NOR gate 194 as before described. The output of inverter 144 in turn is applied as an input to NAND gate 278 to change the state of latch circuit 279 which is comprised of NAND gates 208 and 278.

The output of NAND gate 278 is applied along a line 53 to control the duty cycle of current source 19 of FIG. 1. The output of NAND gate 208 is applied along line 209 as an input to a NAND gate 204. A second input to gate 204 is supplied by latch circuit 182 by way of the output of NOR gate 181. The output of gate 204 in turn may be applied by way of an output line 67 controlling the duty cycle of an external display.

The output of NOR gate 183 is applied by way of line 230 to the decode/driver circuits 61 and 62. When line 230 is at a logic one level, a two digit display driven by signals on output lines 59a and 59b will indicate an 88 to signify the presence of an illegal channel number in latches 107 and 109.

The output of inverter 144 also is applied to the clear inputs of flip-flops 111a–111f and 111h, to the preset input of flip-flop 111g, and to one input of NAND gate 145. In addition, inverter 144 supplies an input by way of line 276 to the preset input of flip-flops 124 and 273 and to the clear inputs of flip-flops 271 and 272, FIG. 4f.

Upon receiving a reset pulse from NOR gate 142, NOR gate 194, FIG. 4f, applies a logic zero state to output line 51 to signify a below channel 6 condition. Further, when a channel 7 operation is signaled by AND gate 65, the output of NOR gate 138 is forced to a logic zero state to thereby raise the output of NOR gate 194 to a logic one state. NOR gates 138 and 194 form latch circuit 139.

After a channel number has been entered at keyboard 100 and a command has been entered by depressing either switch 56 or switch 57, system operation commences upon the receipt of a Count Ready signal applied along line 228 to NOR gate 203, which with NOR gate 199 forms latch circuit 200. NOR gate 199 receives inputs from input line 228 and from NOR gate 142 by way of line 147 and in turn supplies an input to a Schmidt trigger 115.

Figure 4H:
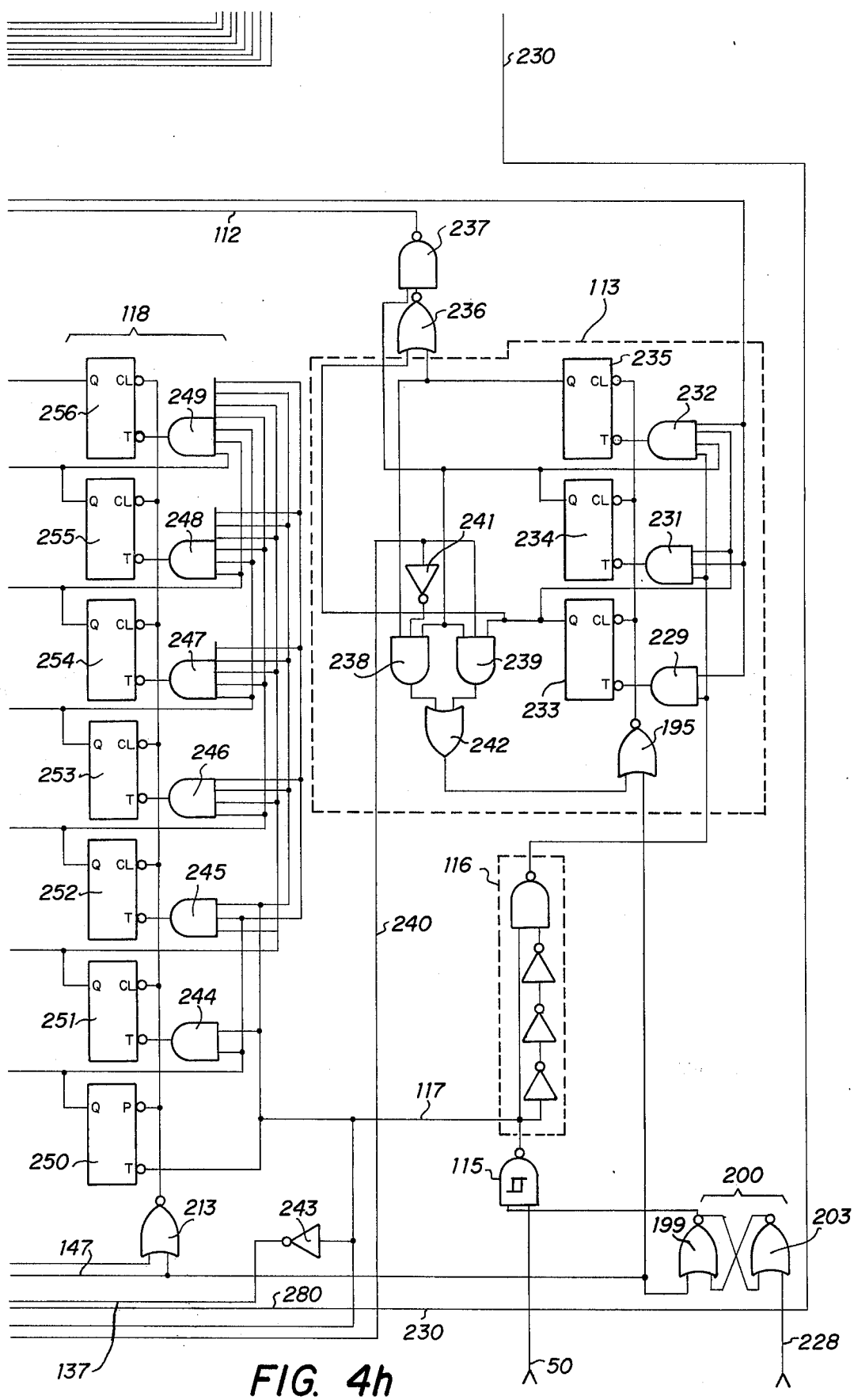

Upon receiving a pulse along line 50, FIG. 4h, from an external analog comparator comprising a part of detector 22, FIG. 1, trigger 115 activates a monostable multivibrator 116, the output of which is applied to an input of AND gates 229, 231 and 232. The outputs of AND gates 229, 231 and 232 in turn are connected to the trigger inputs of flip-flops 233–235, respectively. The clear inputs to flip-flops 233–235 are connected in parallel to the output of a NOR gate 195, which receives reset signals from NOR gate 142 by way of line 147 and from NAND gate 145 by way of line 198.

The Q output of flip-flop 235, FIG. 4h, is connected to an input of a NOR gate 236, the output of which is applied as an input to a NAND gate 237. The Q output of flip-flop 234 is applied as an input to AND gate 232, NAND gate 237, an AND gate 238 and an AND gate 239. The Q output of flip-flop 233 is applied as an input to AND gate 231, to AND gate 239, and to NOR gate 236. An additional input is applied to AND gate 239 by way of line 240 which in turn is connected to the UVF-/UHF signal line 52. Line 240 is also connected by way of inverter 241 to an input of AND gate 238. The outputs of AND gates 238 and 239 in turn are applied as inputs to OR gate 242, the output of which is applied as an input to NOR gate 195.

Flip-flops 233–235, gates 195, 229–232, 236–239 and 242, and inverter 241 comprise a modulo 3/6 counter 113. NAND gate 237 of counter 113 emits a pulse once each six counts when the counter is in a modulo 6 count state as during a VHF operation, or once each three counts while in a modulo 3 count state as during a UHF operation. The pulse is applied along lines 112 and 114 to an inverter 282. The output of inverter 282 supplies a trigger pulse to counter 111 and by way of line 284 to AND gate 285.

A second input to AND gate 285 is supplied by inverter 243 by way of line 137. A third input is supplied by the NOR gate 110c of comparator 110. The output of AND gate 285 in turn is appllied to an input of AND gate 210 and through an inverter 49 to the trigger input of flip-flop 132.

The output of NAND gate 237 is also applied along line 112 as an input to a NOR gate 281 which also receives a Channel Presence signal from a preceding receiver system by way of line 47. A third input is supplied by trigger 115 by way of line 280. The output of NOR gate 281 is applied to the clock input of flip-flops 130 and 131 and as an input to NAND gate 133.

The output of Schmidt trigger 115 is also applied by way of line 117 as an input to an inverter 243, to AND gates 244–249, and to the trigger input of a flip-flop 250. The Q output of flip-flop 250 in turn is applied as an input to AND gates 244–249 and to exclusive NOR gate 257, while the Q output of flip-flop 251 is applied as an input to AND gates 245–249 and to exclusive NOR gate 258. Further, the Q output of flip-flop 252 is connected to an input of AND gates 246–249 and to an input of exclusive NOR gate 259, while the Q output of flip-flop 253 is connected to an input of AND gates 247–249 and to an input of exclusive NOR gate 260. The Q output of flip-flop 254 is applied as an input to AND gates 248 and 249 and as an input to exclusive NOR gate 261. In addition, the Q output of flip-flop 255 is connected as an input to AND gate 249 and as an input to exclusive NOR gate 262. The Q output of flip-flop 256 is connected directly as an input to exclusive NOR gate 263. Flip-flops 250–256 and AND gates 244–249 comprise a seven bit binary counter 118.

The clear inputs of flip-flops 251–256, FIG. 4h, and the present input of flip-flop 250 are each connected in parallel to the output of a NOR gate 213 which receives an input from NOR gate 142 by way of line 147. NOR gate 213 also receives an input from a monostable multivibrator circuit 123.

A second set of inputs to exclusive NOR gates 257–263, FIG. 4f, are supplied by lines 120 leading from the output of ROM 60. The outputs of gates 257–263 are applied as inputs to a NAND gate 264. An additional input to NAND gate 264 is applied by way of a line 265 also leading from the output of ROM 60. Exclusive NOR gates 257–263 and NAND gate 264 comprise a comparator 119 which compares the output state of ROM 60 with the contents of counter 118.

The output of NAND gate 264, FIG. 4f, is applied through an inverter 266 as an input to NOR gate 122. A second input to NOR gate 122 is applied by way of line 240 leading from latch circuit 207. The output of NAND gate 264 is also applied as a trigger to multivibrator 123. More particularly, the output of NAND gate 264 is applied as an input to a NOR gate 267, as is the output of NOR gate 122. The output of NAND gate 264 also is applied through five inverters as a third input to NOR gate 267. Thus, when the output of NAND gate 264 changes state to denote coincidence, a momentary pulse is produced at the output of NOR gate 267 having a pulse width equal to the delay produced by the five inverters. The output of NOR gates 267 in turn is applied as a second input to nor gate 213.

The output of NAND gate 264 is also applied through a first of the inverters, inverter 270, to one input to NAND gate 125, and through a second and third of the inverters 268 and 269, to the second input of NAND gate 125. The circuit comprising inverter 268, inverter 269 and NAND gate 125 comprises a spike rejecting circuit using the gate delays created by inverters 269 and 268.

The output of NAND gate 125 is applied to the trigger input of flip-flop 124 and through an inverter 146 to AND gates 274 and 275 and to a trigger input of a flip-flop 271. The Q output of flip-flop 271 is applied as an input to AND gates 274 and 275, while the Q output of flip-flop 272 is applied as an input to AND gate 274. The outputs of AND gates 274 and 275 in turn are applied to the trigger inputs of flip-flops 273 and 272, respectively. In addition, the preset input of flip-flop 273 and the clear inputs of flip-flops 271 and 272 are connected in parallel to a line 276 leading from the output of inverter 144. AND gates 274 and 275 and flip-flops 271–273 form a ROM address counter 141.

The Q outputs of flip-flops 271–273 are applied as inputs to a conventional three to eight line address decode circuit 277 addressing the ROM 60, FIG. 4e.

The digital controller illustrated in FIGS. 4a–4h may be in any one of four states.

I — QUIESCENT STATE

In the quiescent state, no current exists on input line 58, and capacitor 126 is discharged. Thus, flip-flops 127, 128 and 129 are cleared. The $\overline{Q}$ output of flip-flop 127 is raised thereby to a logic one level forcing a logic zero level at the output of NOR gate 180 to clear flip-flops 130 and 131. The $\overline{Q}$ output is also applied to latch circuit 182 to flag a blank/mute condition on line 67 and turn off an external display.

The Q output of flip-flop 127 is applied to AND gate 134 of latch circuit 135. As switches 56 and 57 are normally open as are the switches of keyboard 100, and since flip-flop 129 has been cleared by the discharge state of capacitor 126 to place the Q output in a logic zero state, the output of NOR gate 166 is at a logic one state. The output of flip-flop circuit 152, therefore, is forced to a logic zero state, and the output of NAND gate 184 is raised to a logic one state which is applied to NAND gate 136. Thus, flip-flop 132 is cleared.

AND gate 63 which tests for the occurrence of a channel 84 number in decade counter 111 has a logic zero state at its output. The output of driver 190 is at a logic zero state. In addition, a logic zero at the output of flip-flop 152 forces a logic zero at the output of AND gate 185. Further, as the output of the lockout circuit 201 is normally at a logic one state as is the output of NOR gate 165 when switch 56 is open, the output of NOR gate 189 is forced to a logic zero state which is applied to NOR gate 142 and the D input of flip-flop 158. One clock period later, the Q output of flip-flop 158 goes to a logic zero which is clocked into flip-flop 159. At the end of a second clock period, the Q output of flip-flop 159 is raised to a logic one state which is applied to NOR gate 142 to force the output of the NOR gate to a logic zero state. For two clock periods, therefore, a logic one state exists at the output of NOR gate 142 to signal a system reset condition.

The reset signal is applied to inverter 144, the output of which transitions to a logic zero state. Thus, flip-flops 111a–111f and 111h are cleared and flip-flop 111g is preset to place a channel 2 indication in decade counter 111. Further, the output of NAND gate 145 is raised to a logic one level and applied along output line 48 to signal a system reset condition to the succeeding receiver system. The logic zero state at the output of inverter 144 also clears flip-flops 271 and 272 of ROM address counter 141 and presets flip-flop 273 to address the first location of ROM 60. In addition, the logic zero state of inverter 144 is applied to the preset input of flip-flop 124 to place counter 113 in a count state.

Since flip-flops 130 and 131 are cleared, the output of inverter 217 is at a logic zero state which is applied to the D input of flip-flop 161 and to one input of NOR gate 218. Thus, for two clock periods, the output of NOR gate 218 is at a logic one state which is applied to an input of NAND gate 143. During this same period of time, the output of NOR gate 142 is at a logic one state which forces the output of NAND gate 143 to a logic zero state. The first digit clear circuit 225, therefore, is preset.

The logic one state at the output of NOR gate 142, which signals a system reset, also forces the output of NOR gate 205 to a logic zero state to signal a VHF operation on line 52. In addition, the output of NOR gate 194 drops to a logic zero state to signal a below channel 6 operation on output line 51. Further, the logic one state of gate 142 is applied along line 147 to NOR gate 213 to clear flip-flops 251–256 and preset flip-flop 250 of binary counter 118. Flip-flops 233–235 of MOD 3/6 counter 113 also are cleared, and the output of NOR gate 199 is lowered to a logic zero state to inhibit the 1.0 MHz pulse train received on input line 50.

II — POWER UP STATE

When power is applied along line 58, capacitor 126 is charged above the input threshold of the clear inputs of flip-flops 127, 128 and 129. Flip-flops 128 and 129, therefore, respond to the clock signal on line 55, and flip-flop 127 is freed to respond to a preset signal.

Before a channel number entry is made by depressing switches of keyboard 100, the output of NAND gate 100m is at a logic one state which is clocked through flip-flops 128, 129 and 156 to raise the output of NOR gate 104 to a logic one level. Also, as the Q output of flip-flop 129 is at a logic one level, the output of NOR gates 165 and 166 are at logic zero levels. A logic one level thus exists at the outputs of NOR gate 175 and AND gate 102e, and line 102d is raised to a logic one level.

When a keyboard entry is made by depressing selected switches of keyboard 100, the output of NOR gate 104 is forced to a logic zero level which is applied through AND gate 102e and along line 102d to preset flip-flop 127. The Q output of flip-flop 127 is thus raised to a logic one state, while the Q output is forced to a logic zero state. This output state of the flip-flop is maintained throughout the period that power is applied to the system by way of line 58.

As before explained, when the first digit of a channel number is entered from keyboard 100, the output of gate 104 drops to a logic zero state. The output of NAND gate 105 thus is raised to a logic one state which is applied to circuit 225, and through three inverters to clock the four least significant digit flip-flops 107a–107d of latch 107.

As flip-flops 221 and 222 of circuit 225 were preset during the quiescent state as before described, the $\overline{Q}$ output of flip-flop 222 is at a logic zero state while the Q output of flip-flop 221 is at a logic one state. NAND gate 224 thus remains at a logic one state inhibiting the clock inputs of latch 109 and preventing the entry of most significant digit data. Since the Q output of flip-flop 221 is at a logic one state, the output of NAND gate 223 is forced to a logic zero state to thereby clear flip-flops 109a–109d of latch 109.

After the first channel digit is entered at keyboard 100 and clocked into latch 107, the output of NOR gate 104 returns to a logic one state. The output of NAND gate 105 is thus forced to a logic zero state to clock flip-flops 221 and 222. The $\overline{Q}$ output of flip-flop 222 is raised to a logic one state, while the Q output of flip-flop 221 is forced to a logic zero state. The output of NAND gate 224 in turn drops to a logic zero state to clock the data stored in latch 107 into latch 109.

Upon entry of a second channel number digit, the output of NOR gate 104 again transitions to a logic zero state to clock the digit into latch 107 as before described.

III — TUNE STATE

Assuming that a channel number has been entered into the most significant and least significant latches 109 and 107, respectively, a normal tune operation is begun by depressing switch 56. The output of AND gate 100m is thereby lowered to a logic zero state which is clocked through flip-flops 128 and 129. Thus, the output of NOR gate 165 is raised to a logic one state which is applied to an input of AND gate 179. As the other input of AND gate 179 is normally at a logic one state, the output of NOR gate 189 is forced to a logic zero state. Two clock periods later, the $\overline{Q}$ output of flip-flop 159 is raised to a logic one state. However, during the time interval defined by the two clock periods, the output of NOR gate 142 is at a logic one level to initiate a system reset as before described. Thus, decade counter III is preset to a channel 2 indication, ROM address counter 141 is cleared to address the first location of ROM 60, flip-flop 124 is preset to enable MOD 3/6 counter 113, binary counter 118 is cleared and the analog comparator input on input line 50 is disabled to await a Count Ready signal on input line 228.

With flip-flop 124 preset for a count state, counter 113 will be free to count as either a modulo 3 or modulo 6 counter as determined by the logic state existing on output line 52 and line 240. More particularly, a logic zero state on output line 52 signifies operation in the VHF range. AND gate 238 is thereby activated to decode a 6, while AND gate 239 is inhibited. When output line 52 is at a logic one state, however, a UHF range is indicated which inhibits AND gate 238 while freeing AND gate 239 to decode a 3 count. Depending on the count state, whether a modulo 3 or modulo 6, every count of 3 or 6 will cause output of OR gate 242 to transition to a logic one state to clear flip-flops 233–235.

The counter then is incremented only after a Count Ready pulse is received on line 228, which forces the output of NOR gate 199 to a logic one state. Schmidt trigger 115 is no longer inhibited, and analog comparator inputs (frequency markers) on line 50 are received to actuate the trigger. Monostable multivibrator 116 responds to the Schmidt trigger and in turn pulses the trigger inputs of flip-flops 233—235.

NOR gate 236 and AND gate 237 receive the Q outputs of flip-flops 233–235 and decode on a binary count of 2. The output of gate 237 then transitions from a logic one to a logic zero state at the binary count of 2, and on a binary count of 3 returns to a logic one state. This sequence of state transitions is fed through inverter 282 to trigger decade counter 111, which is updated to contain the present channel position to which the system is tuned.

Counter 113 continues to count the analog comparator pulses on line 50, and to update counter 111 until the output of the decade counter equals the output of latches 107 and 109. Under a coincidence condition, the output of comparator 110 rises to a logic one state which is reflected at the output of AND gate 285. Two other inputs to AND gate 129 are applied by inverter 282 and by inverter 243.

The output of inverter 282 is at a logic one state once each 6 binary counts when counter 113 is in a modulo 6 state, or once each 3 binary counts when counter 113 is in a modulo 3 state. The output of inverter 243 is at a logic one state when the output of Schmidt trigger 115 is forced to a logic zero state by an incoming pulse on input line 50. When each of the above conditions occur simultaneously, the output of AND gate 285 will rise to a logic one state to signify that the system is tuned to the channel selected at keyboard 100.

During the tuning operation, the analog comparator pulses on input line 50 also are counted by binary counter 118. Concurrently, the output of counter 118 is compared with the output of ROM 60 by means of binary comparator 119. When coincidence occurs, the output of NAND gate 264 is raised to a logic one state. Monostable multivibrator 123 is triggered thereby to produce a momentary logic one state at the output of NOR gate 267 to reset counter 118. In addition, the output of NAND gate 125 transistions to a logic zero state to trigger flip-flop 124 and inhibit counter 113.

During the period that the output of NAND gate 125 is at a logic zero state, the output of inverter 146 is raised to a logic one state. As soon as counter 118 is reset, the output of comparator 119 drops to a logic zero state to return NAND gate 125 to a logic one state. The output of inverter 146 thus returns to the logic zero state to trigger flip-flops 271–273 and increment ROM address counter 141 by one count. This in turn causes the address decode circuit 277 to advance to the next ROM 60 location.

When the output of ROM 60 corresponding to the new location addressed by circuit 277 again compares with the output of counter 118, flip-flop 124 is triggered to allow counter 113 to continue the count of pulses received by way of input line 50.

Thus, in accordance with the invention, a search begins upward from channel 2 during a tuning operation and continues until an invalid channel or skip area is encountered. Such an encounter is signaled by a coincidence occurring between the contents of counter 118 and the output state corresponding to the first addressed word of ROM 60. When coincidence occurs, counter 113 is inhibited and the next location in ROM 60 is addressed. Such location contains a word indicating the number of frequency markers to be skipped. The tuning operation then continues upward until a coincidence again occurs as signified by the output of comparator 119. ROM address counter 141 is again incremented to address the next location in ROM 60, and flip-flop 124 is triggered to free counter 113 and continue the count of pulses from monostable multivibrator 116. This next location of ROM 60 contains a word indicating the number of frequency markers between the present channel location and the next illegal channel or skip area. In further accordance with the invention, ROM 60 contains only words indicating the location of skip areas, and words indicating the number of frequency markers to be skipped.

After a power up stage, the output of NAND gate 134 of latch 135 is at a logic one state, while the output of NAND gate 136 is at a logic zero state. Thus, the output of NAND gate 208 is at a logic zero state which is applied along line 209 to signal a blank/mute condition on line 67. The display tube 26 of FIG. 1 thus is deactivated during the tuning operation. When AND gate 285 is raised to a logic one state to signal a channel acquisition, NOR gate 212 is forced to a logic zero state and the output of NAND gate 208 transitions to a logic one state. The output of NAND gate 278 thereby transitions to a logic zero state which is applied along output line 53 to turn off current source 19 of FIG. 1. In addition, the output of NAND gate 208 is applied along line 209 to remove the blank/mute condition on line 67. This signifies the end of the tune sequence.

IV — SEARCH STATE

A search sequence may be initiated to acquire a channel signal at a channel location by depressing switch 57 after a keyboard 100 entry.

The grounding of switch 57 causes the output of NOR gate 166 to transistion to a logic one state which in turn causes the output of inverter 172 to transition to a logic zero state. The logic zero state at inverter 172 triggers flip-flop 152 and causes the output of NOR gate 151 to rise to a logic one state which is applied to an input of AND gate 185. As the remaining input from lockout circuit 201 is normally at a logic one state, system reset occurs as previously described. In addition, the output of NAND gate 184 transitions to a logic zero state to change the state of latch 135.

The output of NAND gate 134 is thus forced to a logic zero state, while the output of NAND gate 136 transitions to a logic one state to remove the clear signal to flip-flop 132.

Operating in a manner analogous to that of the tune operation, the upward search continues until a coincidence is noted at the output of comparator 110. Then, when the output of gate 285 transitions to a logic one level to signify that the sought for channel location has been acquired, flip-flop 132 is triggered. However, in contradistinction to the tuning operation, the output of NOR gate 212 does not transition to a logic zero state, and thus the output of NAND gate 278 and line 53 remain at a logic one state to allow the current source 19 to continue to drive an oscillator 13 of FIG. 1.

When flip-flop 132 is triggered by the occurrence of a logic one state at the output of AND gate 285, the Q output of the flip-flop is raised to a logic one state which is applied to NOR gate 214. The output of NOR gate 214 thus is forced to a logic zero state which is applied along line 215 to logic switch banks 106 and 108. This in effect switches the input terminals of latches 107 and 109 from keyboard 100 to the Q outputs of counter 111.

The presence of channel information is signaled by NOR gate 281, which normally receives logic state one inputs from NAND gate 237, Schmidt trigger 115 and input line 47. Thus, when a legal channel count is indicated by the output of NAND gate 237 in sync with a Schmidt trigger output and simultaneously a signal is received on input line 47 signifying the presence of a channel signal, flip-flops 130 and 131 are clocked by the trailing edge of the pulse generated by gate 281.

Since the input of flip-flop 130 is tied to the output of flip-flop 132, it will take two consecutive pulses from gate 281 to clock a logic one state from flip-flop 132 through flip-flops 130 and 131. When a logic one state appears at the Q output of flip-flop 131, the logic state is applied to the input of AND gate 211 to force the output of NOR gate 212 to a logic zero state. The state of NAND gates 208 and 278 of latch circuit 279 are thereby changed, and a logic zero state is applied along line 53 to turn the current source off. Control of VCO 13, FIG. 1, in the succeeding receiver system then is turned over to an AFC network.

When the Q output of flip-flop 131 is raised to a logic one state, the sync pulse output of NOR gate 281 also may be clocked through NAND gate 133. The first of these sync pulses resets latch circuit 135 and causes the output of NAND gate 134 to transition to a logic one state. The output of NAND gate 136 thus transitions to a logic zero state, and flip-flop 132 is cleared to force the Q output to a logic zero state.

The flip-flop 132 logic zero state is clocked through flip-flops 130 and 131 by two successive NOR gate 281 sync pulses. Before the logic zero state is clocked through flip-flop 131, however, the sync pulses are clocked through NAND gate 133 and applied to NAND gate 105. The resulting logic one state at the output of NAND gate 105 then is applied to clock latch 107, and by way of first digit clear circuit 225 to clock latch 109. As the output of NOR gate 214 is at a logic zero state during this period, data flow from keyboard 100 is inhibited and latches 107 and 109 load the contents of decade counter 111. A further search thus may be conducted to acquire a signal at the location stored in latches 107 and 109 by merely depressing key 57.

When the Q output of flip-flop 131 returns to a logic zero state, the output of NOR gate 214 transitions to a logic one state which is applied to inverter 217. The monostable multivibrator circuit including NOR gate 218 and flip-flops 160 and 161 then is triggered and a logic one pulse is applied to NAND gate 143 to preset first digit clear circuit 225.

Throughout the search sequence, AND gate 63 is connected to the counter 111 outputs so as to decode a count of 84. Such a count is an indication that the search sequence has progressed beyond the highest possible channel. As illustrated in FIGS. 4a–4h, a logic one at the output of AND gate 63 is applied to driver 190 to initiate a reset sequence. Thus, if a search has proceeded through UHF range and progressed beyond channel 83, a system reset occurs and the search sequence resumes from channel 2 up through the VHF and UHF ranges.

Figure 5:
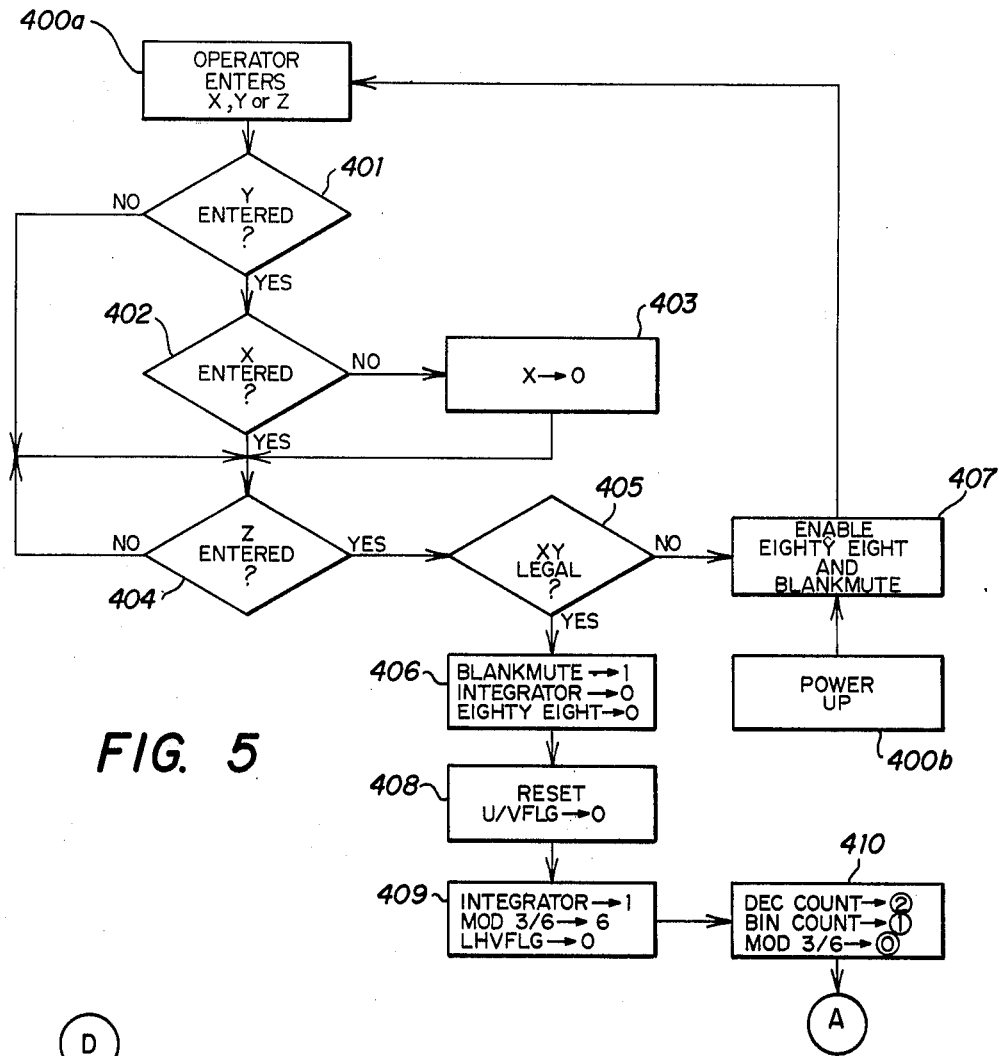
FIGS. 5–7 illustrate a flow diagram for an embodiment of a system of the type shown in FIGS. 4a–4h.
Figure 7:
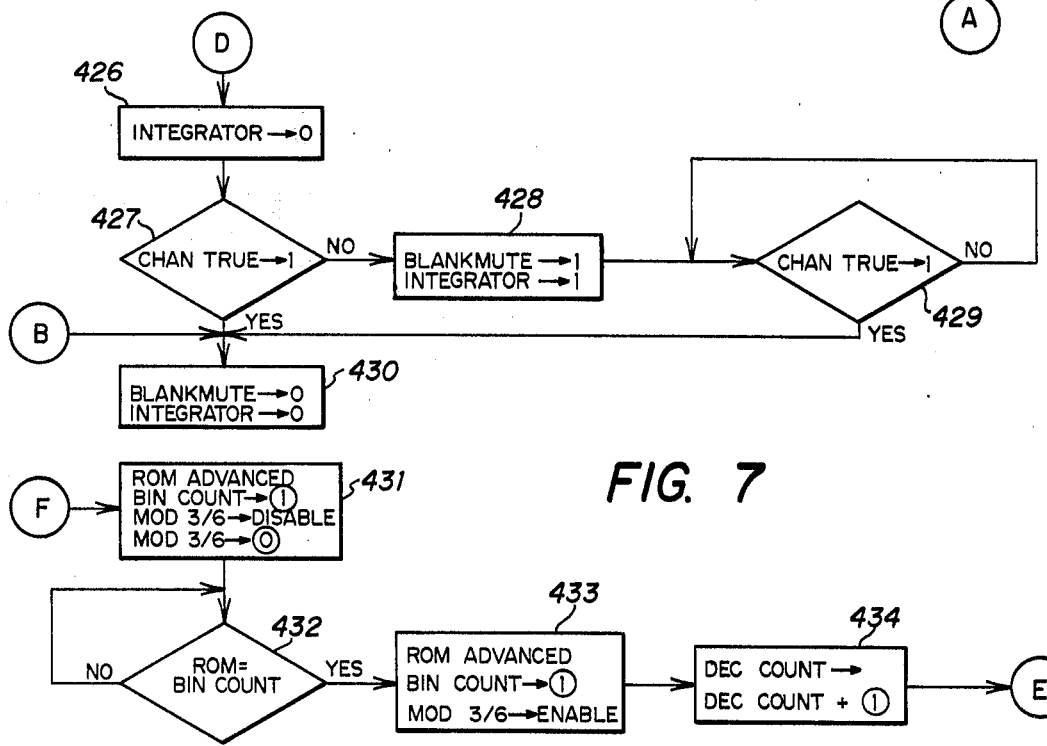
Figure 6:
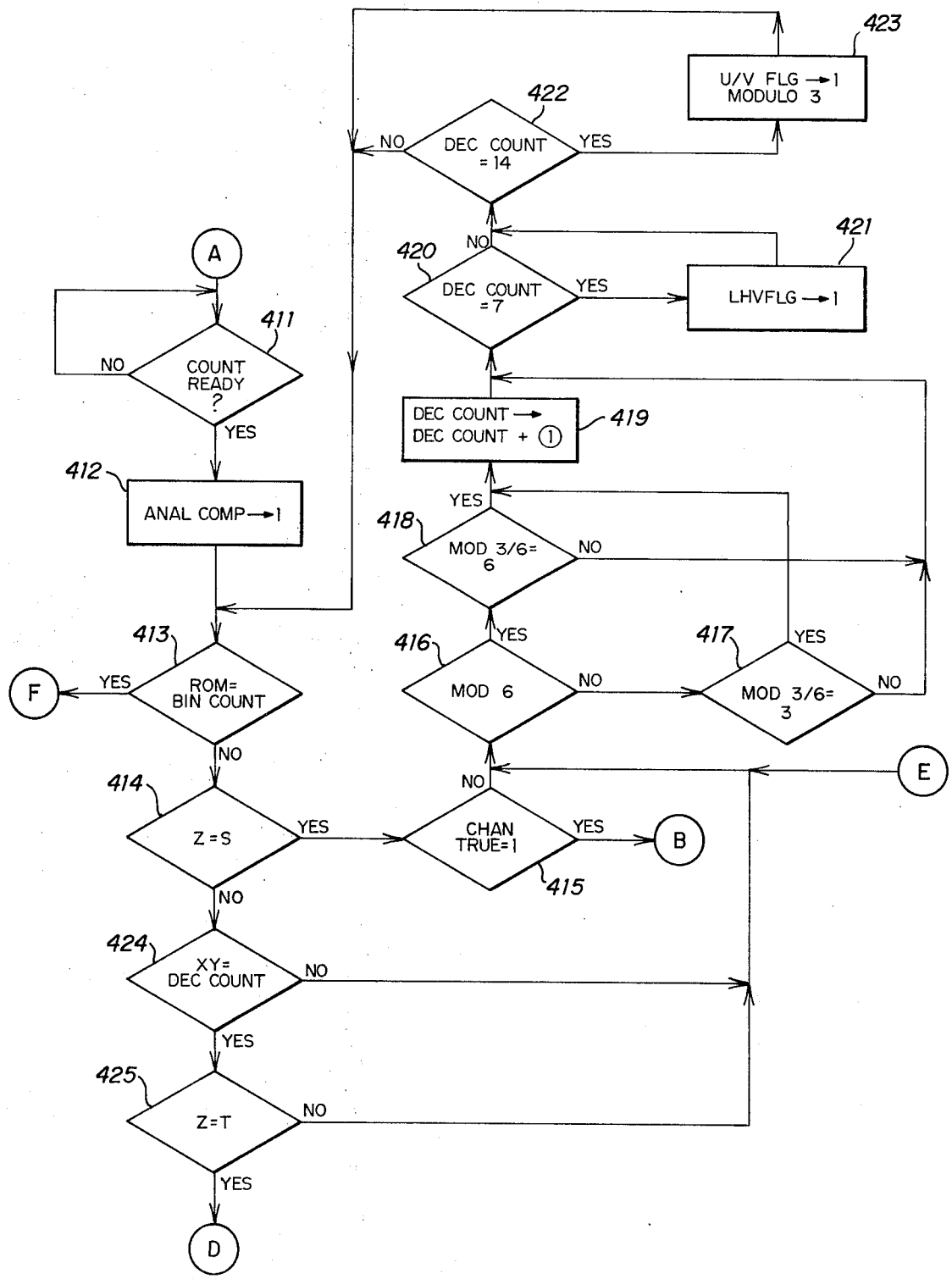

FIGS. 5–7 comprise a flow chart for the digital controller of FIGS. 1 and 4a–4h and are provided to further aid in understanding the operation of controller.

Beginning with state 400a, an operator enters at keyboard 100 either one or both of two digits X and Y, representing the most significant and least significant digits, respectively, of a channel number. In addition, a further command characterized by the letter Z designates either a tune mode or an acquisition (search) mode. It is assumed the system is in a powered-up condition as represented by state 400b.

At state 401, a test is made for the presence of a least significant digit Y. If the least significant digit (LSD) is present, a transfer is made to state 402 where a test for the presence of a most significant digit (MSD) is made. If the MSD is not present, then the MSD latch 109, FIG. 4c, is cleared at state 403 and a transfer to state 404 is made. However, if the MSD is present, a transfer is made directly from state 402 to state 404. Further, a direct transfer is made from state 401 to state 404 when the presence of an LSD is not detected.

At state 404, the presence of either a tune or acquisition command initiates a transfer to state 405, while the absence of either command causes the decision process to reenter state 404 to again test for the presence of a command.

At state 405, the LSD and MSD are tested against usable or legal channel numbers, and if a legal channel has been requested, then a transfer is made to state 406. However, if a nonexistent or forbidden channel has been requested, then a transfer is made to state 407 where a two digit display is activated by way of lines 59a and 59b, FIG. 4g, to display the number 88 indicating an illegal channel selection. After such indication, a blank/mute command is given to deenergize both the video and sound channels of the display. From state 407 a transfer is made to state 400a where the system enters a quiescent state to await additional operator entries.

Assuming that the operator has requested a legal channel, integrator 18 and an illegal entry indicator signal (Eighty Eight) are disabled as are the video and sound channels of the TV receiver.

The tuning process begins at state 408 where the system is reset to begin a low to high frequency scan from channel 2 and where a UHF-VHF flag (U/VFLG) is set for a VHF operation. At state 409, the integrator 18 is energized; the modulo 3/6 counter 113 of FIG. 4h is set to count every sixth fence post, and an RF preselector control flag LHVFLG, corresponding to line 51 of FIG. 4f, is reset to 0 to place preselector 11 of FIG. 1 in a mode for operation between channels 2 and 6.

At state 410, decade counter 111, FIG. 4c, is set for a channel 2 indication, while binary counter 118 counting frequency markers or fence posts is set with a one count and modulo 3/6 counter 113 is cleared.

At state 411 (FIG. 6), a test is made for a Count Ready pulse, line 228 of FIG. 4h, to locate the initial fence post. If a County Ready pulse is present, a transfer is made to state 412. However, if there is no Count Ready pulse, a return to state 411 is made to await the arrival of the pulse.

Upon receipt of the Count Ready pulse, the frequency band marker or fence post input from an analog comparator in detector 22 of FIG. 1 is enabled at state 412. Further, a test is made at state 413 to determine whether comparator 119 of FIG. 4f indicates coincidence between binary counter 118 and the current output state of ROM 60. If so, a transfer is made to node F where a skip loop is initiated to proceed to the next legal channel as will be later explained. However, if coincidence has not occurred, then a transfer is made to state 414 where the command entry is examined. If a search command has been entered, a transfer is made to state 415 where a test is made to determine whether a channel signal exists at the present frequency location. If so, a transfer is made to node B to lock on the present frequency location as will later be explained. However, if a channel signal does not exist at the present frequency location, a transfer is made to state 416.

At state 416, line 240 of FIG. 4h is sensed to determine whether modulo 3/6 counter 113 is in a modulo 6 or modulo 3 count state. If a modulo 3 count state exists, a transfer is made to state 417 to test the contents of counter 113. If a count of 3 exists in the counter, a transfer is made to state 419. However, if a count other than 3 exists in counter 113, a transfer is made from state 417 directly to state 420.

If counter 113 is in a modulo 6 count state, a transfer is made from state 416 to state 418 to test for a count in If a count other than 6 exists in counter 113, a transfer is made to state 420. However, if a count of 6 exists in the counter, a transfer is made to state 419 where decade counter 111 is incremented by 1.

At state 420, the contents of decade counter 111 are examined to determine whether a channel 7 operation is indicated. If so, a transfer is made to state 421 to set the LHVFLG flag, line 51 of FIG. 4f. After the flag is set, a transfer is made to state 422. A direct transfer from state 420 to state 422 is made if a count other than 7 exists in decade counter 111.

The contents of counter 111 are further tested at state 422 to determine whether the system operation is proceeding through the UHF band. If so, a transfer is made to state 423 where the U/VFLG flag is set and counter 113 is placed in a modulo 3 count state. A transfer is then made from state 423 to state 413 where the operation continues as before described. A transfer is made directly from state 422 to state 413 if decade counter 111 contains other than a 14 count.

Assuming that comparator 119 does not indicate a condition of coincidence, and that the operator entered a command other than a search command, a transfer is made from state 414 to state 424 where comparator 110 of FIG. 4c is examined for a coincidence condition. If the contents of decade counter 111 are not identical to the channel number entered at keyboard 100, a transfer is made from state 424 to state 416 where the process continues as before described. However, if the contents of decade counter 111 are identical to the channel number entered at keyboard 100, then comparator 110 will signal the existence of a coincidence and a transfer is made from state 424 to state 425.

The command entered by the operator at keyboard 100 is examined at state 425, and a transfer is made from state 425 to state 416 if a command other than a tune command has been entered. However, if a tune command has been entered, a transfer is made through node D to state 426 (FIG. 7) where integrator 18 is disabled. The transfer is then made to state 427 to test for the existence of a broadcast signal at the present frequency location. If a broadcast signal does not exist, a transfer is made to state 428 where integrator 18 is again enabled and a blank/mute condition is signaled on line 67 of FIG. 4b. The integrator continues to drive the local oscillator upward in frequency until a broadcast signal is detected at state 429. When a broadcast signal is detected, a transfer is made from state 429 to state 430 where the integrator is disabled and the blank/mute condition is removed.

Referring to state 415, FIG. 6, where a search command has been detected and a broadcast signal at the current frequency location exists, a transfer is made from state 415 through node B to state 430 (FIG. 7) where again integrator 18 is disabled and the blank/mute condition is removed.

When the system is in either a tune or search operation and a state of coincidence exists between ROM 60 and the contents of binary counter 118, a transfer is made from state 413 of FIG. 6 through node F to state 431 as before described. At state 431, FIG. 7, the ROM address counter 141 increments the address decode circuit 277 to address the next successive location of ROM 60 containing the bandwidth in fence posts of the skip band at the current frequency location. In addition, binary counter 118 of FIG. 4h is reset and modulo 3/6 counter 113 is both reset and disabled.

A transfer is then made from state 431 to state 432 where the system cycles until binary counter 118 has a binary count equal to the current output state of ROM 60. Integrator 18 continues to drive VCO 13 of FIG. 1 upward in frequency until the number of fence posts counted by binary counter 118 is equal to the binary count indicated by the current output state of ROM 60. Upon coincidence as indicated by comparator 119 of FIG. 4f, a transfer is made from state 432 to state 433 where the ROM address counter 141 again increments the address decode circuit 277. The output state of ROM 60 thereby indicates the bandwidth in fence posts between the current frequency location and the next skip area.

Binary counter 118 is reset and modulo 3/6 counter 113 is enabled before a transfer is made from state 433 to state 434, where decade counter 111 is incremented by 1. A transfer is then made from state 434 through node E to state 416 of FIG. 6, where the process continues as before described.

In accordance with the invention, there is provided a digital tuning controller having internal storage for a selected channel number and for indicia relating to the size and location of unused frequency bands to be skipped. During a tune or search operation, regularly spaced frequency markers produced from the output of a local oscillator are counted while the oscillator is sweeping a band of allocated channels. Aggregates of the count are compared with the internal storage continuously to avoid unused or illegal frequency bands and to acquire a selected channel and a signal within the channel.

Having described the invention in connection with certain specific embodiments thereof, it is to be understood that further modifications may now suggest themselves to those skilled in the art and it is intended to cover such modifications as fall within the scope of the appended claims.

What is claimed is:

1. In a tuner for the selection of one of a plurality of broadcast channels of the same type and standard bandwidth located in a plurality of noncontiguous frequency bands within a frequency spectrum, the channels within each band being continuous, said tuner being adapted to tune continuously and repeatedly through said frequency spectrum containing all of said channels and to produce regularly spaced frequency markers while tuning through said spectrum, a control system comprising:
   a. a keyboard to receive manual entry of the digits of the selected channel number and to produce electrical indicia thereof,
   b. means to receive and store said channel number indicia,
   c. means to initiate tuning traversals of said spectrum by said tuner,
   d. means to receive and count said frequency markers generated during said traversals,
   e. means to receive said frequency markers and produce a channel count indication each time the number of frequency markers receiver indicates tuner traversal of a channel bandwidth,
   f. means to receive and compare said channel count indications and said stored channel number indicia and to arrest the traversal of said tuner when the comparison indicates the selected channel has been tuned by said tuner,
   g. means storing indications of frequency bands within said spectrum not containing channels of said same type, and
   h. means to receive and compare the stored indications and said frequency marker count and to interrupt the reception of said frequency markers by said last mentioned means to receive said frequency markers when this comparison indicates said tuner is traversing said frequency bands within said spectrum not containing channels of said same type.

2. The control system defined in claim 1 further comprising means to receive said channel count indications and to produce a visual display of the channel number currently tuned by said tuner.

3. The control system defined in claim 1 further comprising means to prevent initiation of the tuning traversal of said tuner and to produce a visual error indication when an inoperative channel number is entered through said keyboard.

4. The control system defined in claim 1 further comprising:
   a. means to initiate a search tuning traversal of said spectrum by said tuner; and b. means to detect presence of a broadcast signal occurring in the channel of said same type tuned by said tuner and to arrest the traversal of said tuner in response thereto.

5. The control system defined in claim 4 further comprising means to receive said channel count indications and to produce a visual display of the channel number currently tuned by said tuner.

6. The control system defined in claim 4 further comprising means to prevent initiation of the tuning traversal of said tuner and to produce a visual error indication when an inoperative channel number is entered through said keyboard.

7. In a broadcast television tuner for selecting one of a plurality of television channels some of which are separated from others by frequency bands assigned for broadcast other than television, said tuner being adapted to tune continuously and repeatedly through the spectrum containing said plurality of channels and to produce one MHz markers as the tuner traverses said spectrum, a control system comprising:
   a. means to receive and store electrical signal indicia of the channel number of the desired television channel,
   b. means to receive and count said one MHz markers and to produce a channel marker for each six one MHz markers received,
   c. means to receive and count said channel markers,
   d. means to receive and compare said indicia of channel number and the count of said channel markers and to arrest the spectrum traversal of said tuner when the comparison indicates equality of said channel number and said count,
   e. means having addressively stored therein indicators of the locations within said spectrum of said frequency bands assigned for broadcast other than television,
   f. second means to receive and count said one MHz markers, and
   g. means to receive and compare the count from said second means and the currently addressed indicator of location from the means storing said indicators and to interrupt reception of said one MHz markers by said first mentioned means to receive and count said markers when the comparison indicates said tuner is traversing one of said frequency bands assigned for broadcast other than television and to increment the said means storing said indicators to produce a next successively stored indicator when the comparison indicates said tuner has traversed the boundary limit of one of said frequency bands assigned for broadcast other than television.

8. The control system defined by claim 7 further comprising means to receive said count of channel markers and to produce a visual display of the television channel number currently tuned by said tuner.

9. The control system defined by claim 7 further comprising means to receive said indicia of channel number and to produce an error indication and to prevent initiation of the tuning of said tuner through said spectrum when said indicia received is of an inoperative channel number.

10. The control system as defined in claim 7 wherein said means to receive and compare said count and said currently addressed indicator further produces a signal to reset said second means to receive and count one MHz markers whenever the comparison indicates said tuner has traversed a boundary limit of one of said frequency bands assigned to broadcast other than television.

11. A control system as defined in claim 7 further comprising manually controlled means to initiate tuning of said tuner through said spectrum in a search mode,
   means to indicate presence of a broadcast signal received by said tuner, and
   means responsive to said means to indicate presence of a broadcast signal to arrest the traversal of said tuner when a signal present indication is received while said tuner is traversing a broadcast television channel.

12. The control system defined in claim 11 further comprising means to receive said count of channel markers and to produce a visual display of the television channel number currently tuned by said tuner.

13. A control system as defined in claim 7 further comprising manually controlled means to initiate tuning of said tuner through said spectrum subsequent to the reception of said desired channel number indicia.

14. The control system as defined by claim 13 wherein said means to receive and store electrical signal indicia of the channel number is adapted to receive and store separately the digits of said channel number in the order of most significant digit first and least significant digit next, and
   said control system further comprises means to insert a zero indicia in the most significant digit storage location of said means to receive and store said indicia in response to the activation of said manual control means after the reception of only a single digit indicia by said means to receive and store said indicia.

15. The control system as defined in claim 13 further comprising means to receive said count of channel markers and to produce a visual display of the television channel number currently tuned by said tuner.

16. The control system defined by claim 13 further comprising means to receive said indicia of channel number and to produce an error indication and to prevent initiation of the tuning of said tuner through said spectrum when said indicia is of an inoperative channel number.

17. The control system as defined in claim 13 further comprising manually control means to initiate tuning of said tuner through said spectrum in a search mode,
   means to indicate presence of a broadcast signal received by said tuner, and
   means responsive to said means to indicate presence of a broadcast signal to arrest the traversal of said tuner where a signal present indication is received while said tuner is traversing a broadcast television channel.

18. The control system as defined in claim 17 wherein said means to receive and store electrical signal indicia of the channel number is adapted to receive and store separately the digits of said channel number in the order of most significant digit first and least significant digit next, and
   said control system further comprises means to insert a zero indicia in the most significant digit storage location of said means to receive and store indicia in response to activation of said manually controlled means after the reception of only a single digit indicia by said means to receive and store said indicia.

* * * * *